(12) United States Patent
An et al.

(10) Patent No.: US 12,262,601 B2
(45) Date of Patent: Mar. 25, 2025

(54) LIGHT EMITTING DISPLAY DEVICE AND MANUFACTURING METHOD THEREOF

(71) Applicant: Samsung Display Co., LTD., Yongin-si (KR)

(72) Inventors: Chi Wook An, Hwaseong-si (KR); Seong Min Cho, Seongnam-si (KR); Mi-Ran Ji, Hwaseong-si (KR); Chan Young Kim, Hwaseong-si (KR); Yeong Ho Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 255 days.

(21) Appl. No.: 17/113,837

(22) Filed: Dec. 7, 2020

(65) Prior Publication Data

US 2021/0328107 A1    Oct. 21, 2021

(30) Foreign Application Priority Data

Apr. 21, 2020  (KR) .................. 10-2020-0047919
Jun. 29, 2020  (KR) .................. 10-2020-0079129

(51) Int. Cl.
*H10K 59/131*    (2023.01)
*H10K 59/40*    (2023.01)

(52) U.S. Cl.
CPC ........... *H10K 59/131* (2023.02); *H10K 59/40* (2023.02)

(58) Field of Classification Search
CPC ...... H10K 59/131; H10K 59/82; H10K 59/40; H10K 59/12; G06F 3/044–0448; H01L 27/3276; H01L 27/323
See application file for complete search history.

(56) References Cited

U.S. PATENT DOCUMENTS

2011/0198572 A1    8/2011  Park et al.
2018/0358413 A1*  12/2018  Lee .................. H10K 50/844
(Continued)

FOREIGN PATENT DOCUMENTS

JP         2019-67254      4/2019
KR    10-2011-0065717      6/2011
(Continued)

OTHER PUBLICATIONS

Korean Office Action for Korean Patent Application No. 10-2020-0079129, dated Oct. 18, 2024.

*Primary Examiner* — Lauren R Bell
(74) *Attorney, Agent, or Firm* — KILE PARK REED & HOUTTEMAN PLLC

(57) ABSTRACT

A light emitting display device includes a substrate including a display area and a non-display area adjacent to the display area; a lower pad electrode on the substrate in the non-display area; a planarization layer overlapping the lower electrode; an upper pad electrode on the lower pad electrode and overlapping at least a portion of the lower planarization layer. The planarization layer includes an opening exposing an upper surface of the lower pad electrode, the lower pad electrode and the upper pad electrode are electrically connected to each other through the opening, the lower planarization layer includes an exposed portion exposing an upper surface of the lower planarization layer, and an overlapping portion overlapping at least a portion of the upper pad electrode, and a height of the upper surface of the exposed portion is lower than a height of an upper surface of the overlapping portion.

15 Claims, 31 Drawing Sheets

(56) References Cited

U.S. PATENT DOCUMENTS

| | | | | |
|---|---|---|---|---|
| 2019/0102005 A1* | 4/2019 | Matsumoto | .......... | H10K 59/122 |
| 2019/0163304 A1* | 5/2019 | Shim | ...................... | H01L 27/124 |
| 2019/0196661 A1* | 6/2019 | Baek | .................... | G09G 3/3225 |
| 2020/0411598 A1* | 12/2020 | Gwon | ................. | G06F 3/04164 |
| 2021/0175476 A1* | 6/2021 | Oh | ........................ | H10K 50/86 |
| 2021/0200365 A1* | 7/2021 | Lee | ....................... | G06F 3/0412 |

FOREIGN PATENT DOCUMENTS

| | | |
|---|---|---|
| KR | 10-2011-0093510 | 8/2011 |
| KR | 10-2016-0068519 | 6/2016 |
| KR | 10-2017-0115149 | 10/2017 |
| KR | 10-2019-0023866 | 3/2019 |
| KR | 10-2019-0053742 | 5/2019 |
| KR | 10-2019-0121421 | 10/2019 |

* cited by examiner

LIGHT EMITTING DISPLAY DEVICE AND MANUFACTURING METHOD THEREOF

CROSS-REFERENCE TO RELATED APPLICATION(S)

This application claims priority to and benefits of Korean Patent Application No. 10-2020-0047919 under 35 U.S.C. § 119, filed in the Korean Intellectual Property Office on Apr. 21, 2020, and Korean Patent Application No. 10-2020-0079129 under 35 U.S.C. § 119, filed in the Korean Intellectual Property Office on Jun. 29, 2020, the entire contents of which are incorporated herein by reference.

BACKGROUND

1. Technical Field

The disclosure relates to a light emitting display device and a manufacturing method thereof.

2. Description of the Related Art

A light emitting display device may be a self-luminous display device that displays an image using a light emitting diode (LED) that emits light.

A light emitting display device does not require a separate light source, unlike a liquid crystal display (LCD), and thus may relatively reduce thickness and/or weight of a display device. Further, the light emitting display device may have relatively better quality characteristics such as low power consumption, high luminance, high response speed, and the like. Accordingly, there have been more demands on the development of the light emitting display device as a next-generation display device for portable electronic devices.

The above information disclosed in this background section is only for enhancement of understanding of the background of the described technology, and therefore it may contain information that does not form the prior art that is known to a person of ordinary skill in the art.

SUMMARY

Embodiments have been made in an effort to reduce damage of a pad electrode in a non-display area, which may occur in a subsequent process such as a color filter forming process.

An embodiment provides a light emitting display device that may include a substrate that includes a display area and a non-display area adjacent to the display area; a lower pad electrode disposed on the substrate in the non-display area; a planarization layer that overlaps a portion of the lower pad electrode; and an upper pad electrode disposed on the lower pad electrode and overlapping at least a portion of the planarization layer, wherein the planarization layer may include an opening that exposes an upper surface of the lower pad electrode, the lower pad electrode and the upper pad electrode may be electrically connected to each other through the opening, the planarization layer may include an exposed portion that exposes an upper surface of the planarization layer, and an overlapping portion that overlaps at least a portion of the upper pad electrode, and a height of the upper surface of the exposed portion of the planarization layer may be lower than a height of an upper surface of the overlapping portion of the planarization layer.

The upper pad electrode may include an upper layer including titanium (Ti), an intermediate layer including aluminum (Al), and a lower layer including titanium (Ti), and the lower pad electrode may include an upper layer including titanium (Ti), an intermediate layer including aluminum (Al), and a lower layer including titanium (Ti).

The planarization layer may include at least one of a polyimide, a polyamide, an acrylic resin, benzocyclobutene, and a phenol resin.

The display area may include a semiconductor layer disposed on the substrate; a gate insulating layer that overlaps the semiconductor layer; a gate electrode disposed on the gate insulating layer; an interlayer insulating layer that overlaps the gate electrode; and a source electrode and a drain electrode that are disposed on the interlayer insulating layer and electrically connected to the semiconductor layer, and the lower pad electrode, the source electrode, and the drain electrode may be disposed on a same layer.

The light emitting display device may further include a pixel electrode disposed on the planarization layer; an emission layer disposed on the pixel electrode; and a common electrode disposed on the emission layer, wherein the planarization layer may overlap the source electrode and the drain electrode and may include a via hole, and the drain electrode and the pixel electrode may be electrically connected by the via hole.

The display area may include an encapsulation layer that overlaps the common electrode; a sensing insulating layer disposed on the encapsulation layer; sensing electrodes disposed on the sensing insulating layer; and an inorganic passivation layer that overlaps the sensing electrodes, and the sensing electrodes and the upper pad electrode may be disposed on a same layer.

The light emitting display device may further include a buffer layer disposed between the encapsulation layer and the sensing insulating layer and disposed between the lower pad electrode and the upper pad electrode, and the lower pad electrode and the upper pad electrode may be electrically connected to each other.

An embodiment provides light emitting display device that may include a substrate that includes a display area and a non-display area adjacent to the display area; a first lower pad electrode and a second lower pad electrode that are spaced apart from each other and disposed in the non-display area; a first lower planarization layer that at least partially overlaps the first lower pad electrode; a second lower planarization layer that at least partially overlaps the second lower pad electrode; a first upper pad electrode that overlaps the first lower pad electrode and the first lower planarization layer; a second upper pad electrode that overlaps the second lower pad electrode and the second lower planarization layer; and a light blocking member that at least partially overlaps the first upper pad electrode and the second upper pad electrode, wherein the first upper pad electrode and the second upper pad electrode may be disposed on a same layer.

An upper surface of the light blocking member may be higher than upper surfaces of the first upper pad electrode and the second upper pad electrode.

Each of the first upper pad electrode and the second upper pad electrode may include an upper layer including titanium (Ti), an intermediate layer including aluminum (Al), and a lower layer including titanium (Ti), and each of the first lower pad electrode and the second lower pad electrode may include an upper layer including titanium (Ti), an intermediate layer including aluminum (Al), and a lower layer including titanium (Ti).

A distance from an end of the first lower pad electrode to an end of the second lower pad electrode may be in a range of about 10 μm to about 20 μm.

A distance from an end of the first upper pad electrode to an end of the second upper pad electrode may be about 10 μm or less.

The display area may include a semiconductor layer disposed on the substrate; a gate insulating layer that overlaps the semiconductor layer; a gate electrode disposed on the gate insulating layer; an interlayer insulating layer that overlaps the gate electrode; and a source electrode and a drain electrode that are disposed on the interlayer insulating layer and electrically connected to the semiconductor layer, and the lower pad electrode, the source electrode, and the drain electrode may be disposed on a same layer.

The light emitting display device may further include a pixel electrode disposed on the first lower planarization layer; an emission layer disposed on the pixel electrode; a common electrode disposed on the emission layer; an encapsulation layer disposed on the common electrode; and sensing electrodes disposed on a sensing insulating layer, wherein, the sensing insulating layer may be disposed on the encapsulation layer in the display area, the first lower planarization layer may overlap the source electrode and the drain electrode, and the sensing electrodes and the upper pad electrode may be disposed on a same layer.

The light emitting display device may further include a buffer layer disposed between the encapsulation layer and the sensing insulating layer, disposed between the first lower pad electrode and the first upper pad electrode, and disposed between the second lower pad electrode and the second upper pad electrode, wherein the first lower pad electrode and may be electrically connected to the first upper pad electrode, and the second lower pad electrode may be electrically connected to the second upper pad electrode.

An embodiment provides a manufacturing method of a light emitting display device that may include forming a gate insulating layer and an interlayer insulating layer on a substrate; forming a source electrode and a drain electrode on the interlayer insulating layer in a display area of the substrate; forming a lower pad electrode on the interlayer insulating layer in a non-display area of the substrate; forming a lower planarization layer on the source electrode, the drain electrode, and the lower pad electrode; forming a sensing electrode on a sensing insulating layer on the lower planarization layer in the display area of the substrate; and forming an upper pad electrode on the lower planarization layer in the non-display area of the substrate; forming an inorganic passivation layer to overlap the sensing electrode and the upper pad electrode; forming a light blocking member and a color filter on the inorganic passivation layer in the display area of the substrate, forming an upper planarization layer on the color filter; and etching the inorganic passivation layer to partially expose an upper surface of the lower planarization layer in the non-display area of the substrate.

The forming of the inorganic passivation layer may include etching the inorganic passivation layer by a dry etch process.

An exposed upper surface of the lower planarization layer may have a lower height than an upper surface of the lower planarization layer overlapping the upper pad electrode.

An embodiment provides a manufacturing method of a light emitting display device that may include forming a gate insulating layer and an interlayer insulating layer on a substrate; forming a source electrode and a drain electrode on the interlayer insulating layer in a display area of the substrate; forming a first lower pad electrode and a second lower pad electrode on the interlayer insulating layer in a non-display area of the substrate; forming a lower planarization layer on the source electrode, the drain electrode, the first lower pad electrode, and the second lower pad electrode; forming a sensing electrode on a sensing insulating layer on the lower planarization layer in the display area of the substrate; forming a first upper pad electrode and a second upper pad electrode on the lower planarization layer in the non-display area of the substrate; forming a light blocking member and a color filter on the sensing electrode in the display area of the substrate; and forming the light blocking member to partially overlap the first upper pad electrode and the second upper pad electrode in the non-display area of the substrate.

The forming of the light blocking member may include forming the light blocking member between the first upper pad electrode and the second upper pad electrode in the non-display area of the substrate.

An embodiment provides a light emitting display device that may include a substrate that includes a display area and a non-display area adjacent to the display area; a lower pad electrode disposed on the substrate in the non-display area; a upper pad electrode disposed on a pad inorganic insulating layer; an inorganic passivation layer disposed on the upper pad electrode or the pad inorganic insulating layer; and a planarization layer disposed on the inorganic passivation layer, wherein an end of the planarization layer may be aligned with an end of the inorganic passivation layer.

An end of a lower surface of the planarization layer may be aligned with an end of an upper surface of the inorganic passivation layer.

The inorganic passivation layer may be disposed to partially overlap the upper pad electrode, and an upper surface of the pad electrode may partially expose the light emitting display device.

The inorganic passivation layer may be disposed on the pad inorganic insulating layer, and an end of the inorganic passivation layer may be spaced apart from opposite ends of the pad electrode.

The planarization layer may include an organic insulating material.

An embodiment provides a light emitting display device that may include a substrate that includes a display area and a non-display area adjacent to the display area; an interlayer insulating layer disposed on the substrate; a lower pad electrode disposed on the interlayer insulating layer in the non-display area; a buffer layer that overlaps a portion of the lower pad electrode; and an upper pad electrode disposed on the lower pad electrode to overlap at least a portion of the buffer layer, wherein a thickness of a portion of the buffer layer which does not overlap the upper pad electrode may be thinner than a thickness of a portion overlapping the upper pad electrode.

The upper pad electrode may include an upper layer including titanium (Ti), an intermediate layer including aluminum (Al), and a lower layer including titanium (Ti), and the lower pad electrode may include an upper layer including titanium (Ti), an intermediate layer including aluminum (Al), and a lower layer including titanium (Ti).

The display area may include a semiconductor layer disposed on the substrate; a gate insulating layer that overlaps the semiconductor layer; a gate electrode disposed on the gate insulating layer; an interlayer insulating layer that overlaps the gate electrode; a source electrode and a drain electrode that are disposed on the interlayer insulating layer and electrically connected to the semiconductor layer; and a lower planarization layer that overlaps the source electrode and the drain electrode, wherein the lower pad electrode, the source electrode, and the drain electrode may be disposed on a same layer.

The light emitting display device may further include a pixel electrode disposed on the lower planarization layer; an emission layer disposed on the pixel electrode; and a common electrode disposed on the emission layer, wherein the lower planarization layer may overlap the source electrode and the drain electrode and may include a via hole, and the drain electrode and the pixel electrode may be electrically connected by the via hole.

The display area may include an encapsulation layer that overlaps the common electrode; a sensing insulating layer disposed on the encapsulation layer; sensing electrodes disposed on the sensing insulating layer; and an inorganic passivation layer that overlaps the sensing electrodes, wherein the sensing electrodes and the upper pad electrode may be disposed on a same layer, the buffer layer may be disposed between the encapsulation layer and the sensing insulating layer, and the lower pad electrode may be electrically connected to the upper pad electrode.

According to an embodiment, when forming the pad electrode in the non-display area, a subsequent process may be performed after depositing an inorganic protective film on the pad electrode, thereby reducing damage to pad electrodes that may occur in a subsequent process such as a color filter forming process.

In addition, since the metal layer of the pad electrode may be protected, the performance of the pad electrode may also be maintained.

According to embodiments, end portions of the upper pad electrodes may be protected by the light blocking member, and thus the upper pad electrodes may be formed and damage of the upper pad electrodes that may occur in the color filter forming process may be reduced.

BRIEF DESCRIPTION OF THE DRAWINGS

The accompanying drawings, which are included to provide a further understanding of the disclosure and are incorporated in and constitute a part of this specification, illustrate embodiments, and together with the description serve to explain the disclosure in conjunction with the accompanying drawings in which.

DETAILED DESCRIPTION OF THE EMBODIMENTS

Figure 1:
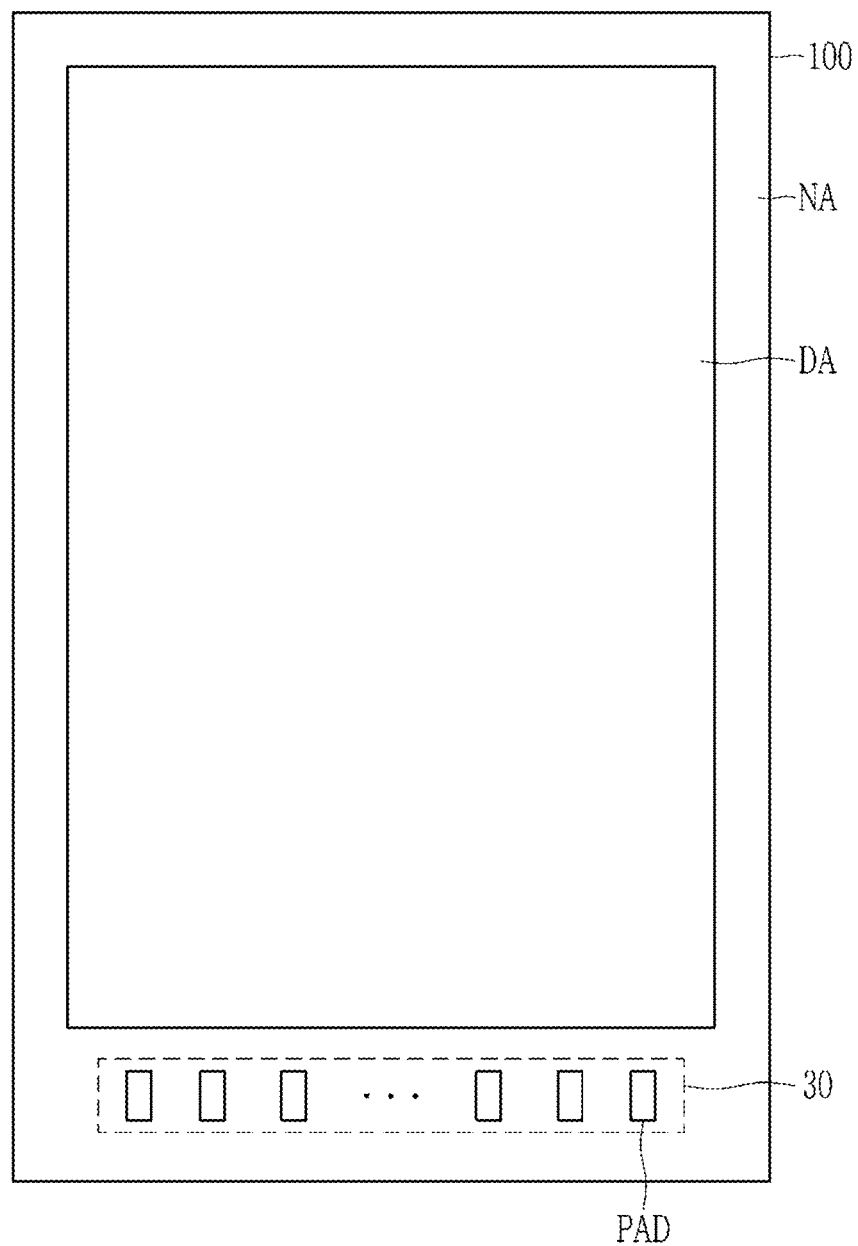
FIG. 1 illustrates a schematic top plan view of a light emitting display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

To clearly describe the disclosure, parts that are irrelevant to the description may be omitted, and like numerals refer to like or similar constituent elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B".

While such terms as "first," "second," etc., may be used to describe various components, such components are not be limited to the above terms. The above terms are used only to distinguish one component from another. For example, a first element referred to as a first element in one embodiment may be referred to as a second element in another embodiment without departing from the scope of the appended claims.

It will be understood that when an element such as a layer, film, region, or substrate is referred to as being "on" another element, it may be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In addition, unless explicitly described to the contrary, the word "comprise" and variations such as "comprises" or "comprising", "include", "includes", "including", "have", "has", "having" will be understood to imply the inclusion of stated elements but not the exclusion of any other elements.

Further, in the specification, the phrase "in a plan view" means when an object portion is viewed from above, and the phrase "in a schematic cross-sectional view" means when a schematic cross-section taken by vertically cutting an object portion is viewed from the side.

In addition, in the specification, "connected" means that two or more components are not only directly connected, but two or more components may be connected indirectly through other components, physically connected as well as being electrically connected, or it may be referred to be different names depending on the location or function, but may include connecting each of parts that are substantially integral to each other.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
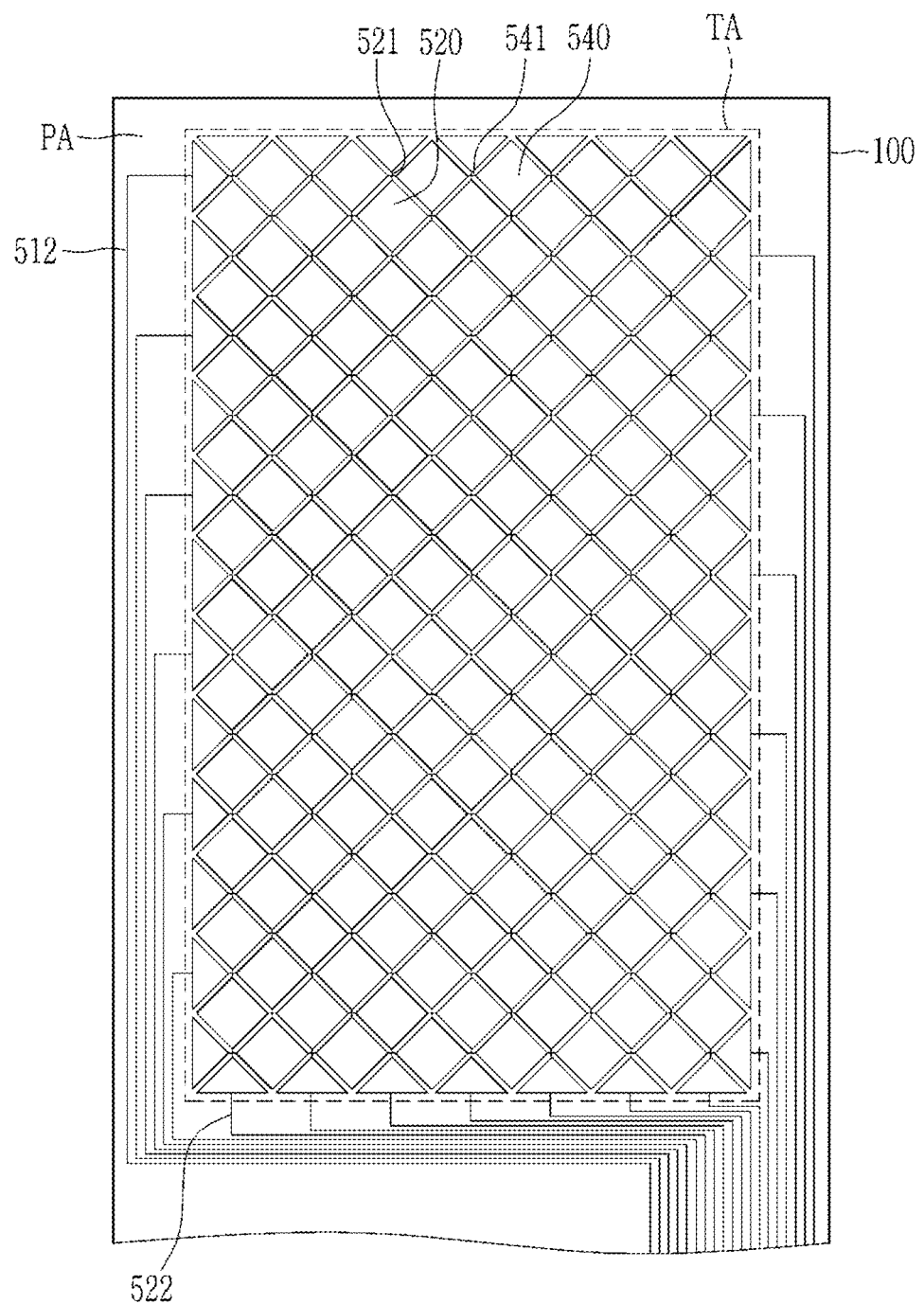
FIG. 2 illustrates a top plan view of a portion including a sensor in a light emitting display device according to an embodiment.

Hereinafter, a light emitting display device and a manufacturing method thereof will be described in detail with reference to the drawings FIG. 1 illustrates a schematic top plan view of a light emitting display device according to an embodiment, and FIG. 2 illustrates a top plan view of a portion including a sensor in a light emitting display device according to an embodiment.

Referring to FIG. 1, the light emitting display device according to an embodiment may include a substrate 100 and a pad portion 30.

The substrate 100 may include a display area DA and a non-display area NA. The display area DA may be an area where pixels including light emitting diodes and transistors may be formed or disposed to display an image, and the non-display area NA may be an area in which an image may not be displayed and may surround or may be adjacent to the display area DA and may include a pad portion 30 on which a pad PAD for applying a driving signal to a pixel may be formed.

Pixels (not illustrated) each including a transistor, a light emitting diode, and the like may be formed or disposed in the display area DA.

In the non-display area NA, a driving voltage line (not illustrated), a driving low voltage line (not illustrated), and the pad portion 30 may be formed to transfer driving signals such as voltages and signals to pixels formed or disposed in the display area DA.

A sensing area TA including sensing electrodes 520 and 540 of FIG. 2 may be formed or disposed in the display area DA to recognize a touch, and sensing wires (512 and 522 in FIG. 2) for applying signals to sensing electrodes may be additionally formed or disposed in the non-display area NA. The sensing wires 512 and 522 and the sensing electrodes 520 and 540 that may be electrically connected to the sensing wires 512 and 522 will be described with reference to FIG. 2.

The pad portion 30 may be positioned or disposed in a portion of the non-display area NA, and may include pads PAD. The pads PAD may apply signals to voltage lines (not illustrated) electrically connected to the display area DA, and sensing wires (512 and 522 in FIG. 2). A flexible printed circuit board (not illustrated) may be attached to the non-display area NA. The flexible printed circuit board (FPCB) may be electrically connected to the pad portion 30 to transfer a driving signal for driving a pixel or the like to the pad portion 30 from the outside. The flexible printed circuit board (FPCB) and the pad portion 30 may be electrically connected by an anisotropic conductive film. As an example, a driving integrated circuit (not illustrated) may be additionally included, and a driving signal outputted from the driving integrated circuit may be supplied to each pixel through the pads PAD of the pad portion 30.

Referring to FIG. 2, the substrate 100 may include a sensing area TA in which the sensing electrodes 520 and 540 may be formed or disposed at an upper portion of the display area DA, and a peripheral area PA surrounding or adjacent to the sensing area TA. According to an embodiment, the sensing area TA may include the display area DA of FIG. 1, or may include a portion of the non-display area NA, and the peripheral area PA may be a non-display area NA excluding the sensing area TA from the non-display area NA of FIG. 1.

The sensing area TA may include the sensing electrodes 520 and 540. The sensing electrodes 520 and 540 may include first sensing electrodes 520 and second sensing electrodes 540.

The first sensing electrodes 520 and the second sensing electrodes 540 may be electrically separated from each other. According to an embodiment, the first sensing electrodes 520 may be sensing input (Tx) electrodes, and the second sensing electrodes 540 may be sensing output (Rx) electrodes. The first sensing electrodes 520 may be sensing output (Rx) electrodes, and the second sensing electrodes 540 may be sensing input (Tx) electrodes.

The first sensing electrodes 520 and the second sensing electrodes 540 may be alternately distributed so as to not overlap each other in the sensing area TA, and may be disposed in a mesh form. The first sensing electrodes 520 may be disposed in a column direction and the first sensing electrodes 520 may be disposed in a row direction, and the second sensing electrode 540 may also be disposed in the column direction and the second sensing electrode 540 may also be disposed in the row direction.

The first sensing electrodes 520 and the second sensing electrodes 540 may be disposed at a same layer, but may be disposed at different layers. The first sensing electrode 520 and the second sensing electrode 540 may have a substantially rhombus shape, but are not limited thereto, and may have a substantially polygonal shape such as a quadrangle or a hexagon, or a substantially circular or substantially elliptical shape, and may be embodied in various shapes such as having a protrusion to improve sensitivity of a sensor. The first sensing electrodes 520 and the second sensing electrodes 540 may be formed of transparent conductors or opaque conductors, and each of the first and second sensing electrodes 520 and 540 may have openings. The openings formed in the sensing electrodes 520, and 540 may serve to allow light emitted from a light emitting diode to be emitted to the front without interference.

The first sensing electrodes 520 may be electrically connected to each other by a first sensing electrode connector 521 (also referred to as a bridge), and the second sensing electrodes 540 may be electrically connected to each other by a second sensing electrode connector 541. In a case that the first sensing electrodes 520 may be electrically connected to each other in a first direction, the second sensing electrodes 540 may be electrically connected to each other in a second direction intersecting the first direction. In a case that the first sensing electrodes 520 and the second sensing electrodes 540 may be disposed at a same layer, one of the first sensing electrode connector 521 and the second sensing electrode connector 541 may be disposed at the same layer as that of the first sensing electrodes 520 and the second sensing electrodes 540, and the other one may be disposed at a different layer from that of the first sensing electrodes 520 and the second sensing electrodes 540. As a result, the first sensing electrodes 520 and the second sensing electrodes 540 may be electrically separated. The sensing electrode connector disposed at the different layer may be disposed at upper layer or a lower layer of the first sensing electrodes 520 and the second sensing electrodes 540, and in embodiments described below, descriptions will be made focusing on an embodiment in which the sensing electrode connector may be disposed on the lower layer, for example, a layer closer to the substrate.

The sensing wires 512 and 522 may be respectively electrically connected to the first sensing electrodes 520 and the second sensing electrodes 540 in the peripheral area PA. The first sensing wire 512 may be electrically connected to the second sensing electrodes 540 disposed in the row direction, and the second sensing wire 522 may be electrically connected to the first sensing electrodes 520 disposed in the column direction. According to an embodiment, the first sensing wire 512 and the second sensing wire 522 may be electrically connected to some or a predetermined number of the pads PAD included in the pad portion 30 of FIG. 1.

In FIG. 2, a sensor of a mutual-cap type that may sense a touch using two sensing electrodes 520 and 540 is illustrated. However, according to an embodiment, it may be formed as a sensor of self-cap type that may sense a touch using only one sensing electrode.

Hereinafter, a structure of a light emitting display device including a sensing area TA will be described based on a schematic cross-sectional view thereof in a display area DA with reference to FIG. 3 and FIG. 4.

Figure 3:
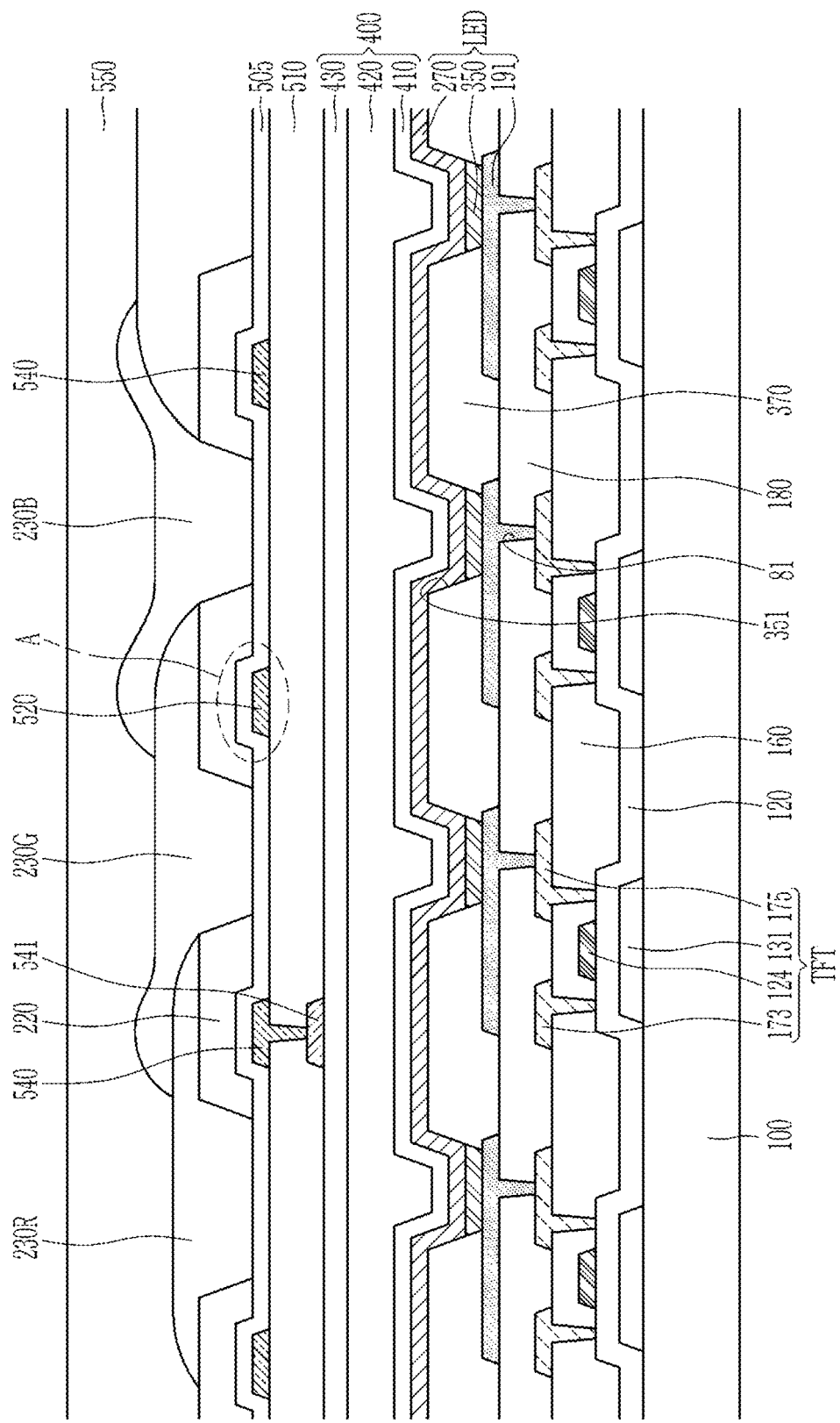
FIG. 3 illustrates a schematic cross-sectional view showing a portion of a display area in a light emitting display device according to an embodiment.
Figure 4:
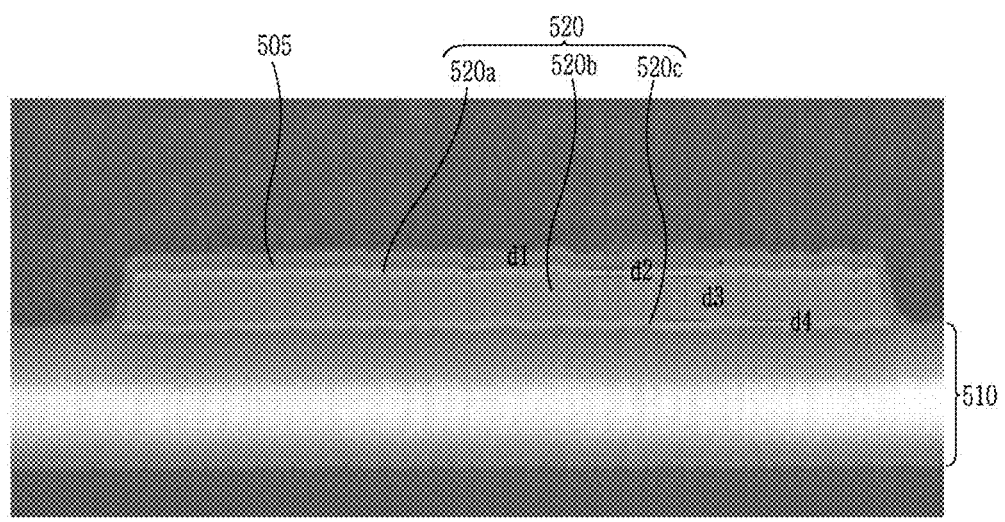
FIG. 4 illustrates a scanning electron microscope image of an enlarged view of a region A in FIG. 3.

FIG. 3 illustrates a schematic cross-sectional view showing a portion of a display area in a light emitting display device according to an embodiment, and FIG. 4 illustrates a scanning electron microscope image of an enlarged view of a region A in FIG. 3.

Referring to FIG. 3, in the light emitting display device according to an embodiment, the display area DA may include a substrate 100, a transistor (TFT) including a semiconductor layer 131, a gate electrode 124, a source electrode 173, and a drain electrode 175, a gate insulating layer 120, an interlayer insulating layer 160, a lower planarization layer 180, a pixel electrode 191, a light emitting layer 350, a partition wall 370, a common electrode 270, and an encapsulation layer 400. Herein, the pixel electrode 191, the emission layer 350, and the common electrode 270 may constitute a light emitting diode LED. The light emitting display device may include a sensing area TA positioned or disposed at an upper portion of the display area DA, and the sensing area TA may include a sensing insulating layer 510, sensing electrodes 520 and 540, a sensing electrode connector 541, and an inorganic passivation layer 505. A light blocking member 220, color filter layers 230R, 230G, and 230B, and an upper planarization layer 550 may be included at an upper portion of the sensing region TA.

The substrate 100 may include a material that may have a rigid property such as glass so as to not bend, or may include a flexible material that may be bent, such as plastic or a polyimide. Although not illustrated in FIG. 3, a buffer layer (not illustrated), a barrier layer (not illustrated), or the like may be disposed on the substrate 100 to flatten the surface of the substrate 100 and to block penetration of impurities.

A semiconductor layer 131 may be disposed on the substrate 100. The semiconductor layer 131 may be formed of an oxide semiconductor, amorphous silicon, polycrystalline silicon, or other suitable material, and may include a channel region, a source region, and a drain region divided according to whether or not they may be doped with impurities, and the source region and the drain region may have conductive characteristic corresponding to a conductor.

The gate insulating layer 120 may be disposed on the substrate 100 to cover or overlap the semiconductor layer 131 and the substrate 100. The gate insulating layer 120 may include an inorganic insulating layer including a silicon oxide (SiOx), a silicon nitride (SiNx), a silicon oxynitride (SiONx), within the spirit and the scope of the disclosure The gate electrode 124 may be disposed on the gate insulating layer 120. The gate electrode 124 may include a metal such as copper (Cu), molybdenum (Mo), aluminum (Al), silver (Ag), chromium (Cr), or tantalum (Ta), or a metal alloy thereof, and it may be formed as a single layer or a multilayer. A region of the semiconductor layer 131 that may overlap the planar gate electrode 124 may be a channel region.

The interlayer insulating layer 160 may be disposed on the substrate 100 to cover or overlap the gate electrode 124 and the gate insulating layer 120. The interlayer insulating layer 160 may include an inorganic insulating layer including a silicon oxide (SiOx), a silicon nitride (SiNx), a silicon oxynitride (SiONx), within the spirit and the scope of the disclosure The source electrode 173 and the drain electrode 175 may be disposed on the interlayer insulating layer 160. The source electrode 173 and the drain electrode 175 may be electrically connected to the source region and the drain region of the semiconductor layer 131 through openings formed in the interlayer insulating layer 160 and the gate insulating layer 120, respectively. Accordingly, the semiconductor layer 131, the gate electrode 124, the source electrode 173, and the drain electrode 175 described above may constitute one thin film transistor (TFT). According to an embodiment, the transistor TFT may include only the source region and the drain region of the semiconductor layer 131 instead of the source electrode 173 and the drain electrode 175.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof, and it may be formed of a single layer or a multilayer. The source electrode 173 and the drain electrode 175 according to an embodiment may be a triple layer including an upper layer, an intermediate layer and a lower layer, the upper layer and the lower layer may include titanium (Ti), and the intermediate layer may include aluminum (Al).

The lower planarization layer 180 may be disposed on the source electrode 173 and the drain electrode 175. The lower planarization layer 180 may be disposed on the substrate 100 to cover or overlap the source electrode 173, the drain electrode 175, and the interlayer insulating layer 160. The lower planarization layer 180, for planarizing a surface of the substrate 100 provided with a transistor (TFT), may be an organic insulating layer, and may include at least one material of a polyimide, a polyamide, an acrylic resin, benzocyclobutene, and a phenol resin.

The pixel electrode 191 may be disposed on the lower planarization layer 180. The pixel electrode 191 may also be referred to as an anode, and may be formed as a single layer including a transparent conductive oxide film and a metal material or as multiple layers including them. The transparent conductive oxide film may include an indium tin oxide (ITO), a poly-ITO, an indium zinc oxide (IZO), an indium gallium zinc oxide (IGZO), and an indium tin zinc oxide (ITZO), and the metal material may include silver (Ag), molybdenum (Mo), copper (Cu), gold (Au), and aluminum (Al).

The lower planarization layer 180 may include a via hole 81 (also referred to as an opening) exposing the drain electrode 175, and the drain electrode 175 and the pixel electrode 191 may be physically and electrically connected through the via hole 81 of the lower planarization layer 180. Accordingly, the pixel electrode 191 may receive an output current to be transferred from the drain electrode 175 to the emission layer 350.

The partition wall 370 may be disposed on the lower planarization layer 180. The partition wall 370 may also be referred to as a pixel defining layer (PDL), and may include a pixel opening 351 in which a portion of an upper surface of the pixel electrode 191 may be exposed. The pixel opening 351 of the partition wall 370 may partition a formation position of the emission layer 350 to dispose the emission layer 350 on a portion exposed from the upper surface of the pixel electrode 191. The partition wall 370 may be formed as an organic insulator including at least one material of a polyimide, a polyamide, an acryl resin, benzocyclobutene, and a phenol resin. As an example, according to an embodiment, the partition wall 370 may be formed of a black pixel defining layer (PDL) having a black color.

The emission layer 350 may be disposed in a pixel opening 351 partitioned by the partition wall 370. The emission layer 350 may include organic materials that emit red, green, and blue light. The emission layer 350 emitting red, green, and blue light may include a low molecular weight or high molecular weight organic material. In FIG. 3, the emission layer 350 is illustrated as a single layer, but in practice, an auxiliary layer such as an electron injection layer, an electron transport layer, a hole transport layer, and a hole injection layer may be included above and below the light emitting layer 350, the hole injection layer and the hole transport layer may be disposed below the emission layer 350, and the electron transport layer and the electron injection layer may be disposed above the emission layer 350.

A common electrode 270 may be disposed on the partition wall 370 and the emission layer 350. The common electrode 270 may be referred to as a cathode, and may be formed of a transparent conductive layer, including an indium tin oxide (ITO), an indium zinc oxide (IZO), an indium gallium zinc oxide (IGZO), an indium tin zinc oxide (ITZO), for example. The common electrode 270 may have a translucent characteristic, and in this case, may constitute a microcavity together with the pixel electrode 191. According to such a microcavity structure, light of a specific wavelength may be emitted to an upper part by the characteristics and spacing between both of the electrodes, and as a result, red, green, or blue may be displayed.

An encapsulation layer 400 may be disposed on the common electrode 270. The encapsulation layer 400 may include at least one inorganic layer and at least one organic layer, and in an embodiment, may include a first inorganic encapsulation layer 410, an organic encapsulation layer 420, and a second inorganic encapsulation layer 430. The first inorganic encapsulation layer 410, the organic encapsulation layer 420, and the second inorganic encapsulation layer 430 may be located or disposed in portions of the display area DA and the non-display area NA, and according to an embodiment, the organic encapsulation layer 420 may be formed or disposed around the display area DA, and the first inorganic encapsulation layer 410 and the second inorganic encapsulation layer 430 may be formed or disposed up to the non-display area NA. The encapsulation layer 400, which is for protecting the light emitting diode from moisture or oxygen that may be introduced from the outside, may be formed or disposed to directly contact first ends of the first inorganic encapsulation layer 410 and the second inorganic encapsulation layer 430. According to an embodiment, the encapsulation layer 400 may include a structure in which an inorganic layer and an organic layer may be sequentially stacked.

A sensing insulating layer 510, the sensing electrodes 520 and 540, a sensing electrode connector 541, and an inorganic passivation layer 505 may be disposed on the encapsulation layer 400.

In an embodiment, the sensing insulating layer 510, the sensing electrode connector 541, and the sensing electrodes 520 and 540 may constitute a sensor, which may be classified into a resistive type, a capacitive type, an electromagnetic type, and an optical type. The sensor according to an embodiment uses a capacitive type of sensor. A buffer layer (see 501 of FIG. 12) including an inorganic material may be disposed between the sensing electrode connector 541, the sensing insulating layer 510, and the encapsulation layer 400.

The sensing electrode connector 541 may be disposed on the encapsulation layer 400, and a sensing insulating layer 510 covering or overlapping the sensing electrode connector 541 may be disposed thereon. The sensing insulating layer 510 may be an inorganic insulating layer, and may include an organic material according to an embodiment. An inorganic material included in the inorganic insulating layer may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. An organic material thereof may be at least one of an acrylic resin, a methacrylic resin, a polyisoprene, a vinyl resin, an epoxy resin, a urethane resin, a cellulose resin, and a perylene resin.

The sensing electrodes 520 and 540 may be disposed on the sensing insulating layer 510, and the first sensing electrode 520 and the second sensing electrode 540 may be electrically insulated. The sensing insulating layer 510 may include an opening exposing an upper surface of the sensing electrode connector 541, and the sensing electrode connector 541 may be electrically connected to the second sensing electrodes 540 through the opening of the sensing insulating layer 510 to electrically connect two adjacent second sensing electrodes 540. Meanwhile, a first sensing electrode connecting portion 521 electrically connecting the first sensing electrodes 520 may be formed or disposed on a same layer as that of the first sensing electrodes 520 and the second sensing electrodes 540.

The sensing electrodes 520 and 540 may include a conductive material having good conductivity. The sensing electrode 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof, and may be formed of a single layer or a multilayer. In this case, the sensing electrodes 520 and 540 may include an opening so that light emitted from the light emitting diode is emitted upward without interference. According to an embodiment, the sensing electrodes 520 and 540 may be a triple layer including an upper layer, an intermediate layer, and a lower layer, the upper layer and the lower layer may include titanium (Ti), and the intermediate layer may include aluminum (Al).

An inorganic passivation layer 505 covering or overlapping the sensing electrodes 520 and 540 and the sensing insulating layer 510 may be disposed on the sensing electrodes 520 and 540. The inorganic passivation layer 505 may also be disposed on a pad electrode to prevent damage applied to the pad electrode in a subsequent process (for example, a color filter process) during a process of forming the pad electrode. The inorganic passivation layer 505 and the pad electrode will be described in detail below in FIG. 5.

Referring to FIG. 4, a schematic cross-sectional structure of the first sensing electrode 520 among the sensing electrodes 520 and 540 is illustrated in detail.

According to an embodiment, the first sensing electrode 520 disposed on the sensing insulating layer 510 may include an upper layer 520a, an intermediate layer 520b, and a lower layer 520c. According to an embodiment, the upper layer 520a and the lower layer 520c of the first sensing electrode 520 include titanium (Ti), and the intermediate layer 520b may include aluminum (Al). A thickness d2 of the upper layer 520a may be about 48.19 nm, a thickness d3 of the intermediate layer 520b may be about 302.9 nm, and a thickness d4 of the lower layer 520c may be about 48.19 nm.

The inorganic passivation layer 505 may be disposed on the sensing insulating layer 510 and the first sensing electrode 520, and a thickness d1 of the inorganic passivation layer 505 may be about 82.62 nm. The inorganic passivation layer 505 may remain without being etched in the display area DA and/or the sensing area TA, but the inorganic protective film 505 may be removed by a dry etching process in the non-display area NA and/or the peripheral area PA, which will be described later.

A light blocking member 220 and the color filter layers 230R, 230G, and 230B may be disposed on the inorganic passivation layer 505.

The light blocking member 220 may be disposed to overlap the sensing electrodes 520 and 540 in a plan view, and may be disposed to not overlap the emission layer 350 in a plan view. This is to prevent the light emitting layer 350 capable of displaying an image from being obscured by the light blocking member 220 and the sensing electrodes 520 and 540.

The color filter layers 230R, 230G, and 230B may be positioned or disposed on the inorganic passivation layer 505 and light blocking member 220. The color filter layers 230R, 230G, and 230B include a red color filter 230R for transmitting red light, a green color filter 230G for transmitting green light, and a blue filter 230B for transmitting blue light. Each of the color filters 230R, 230G, and 230B may be disposed to overlap the emission layer 350 of the light emitting diode in a plan view. The emission layer 350 overlapping the red color filter 230R may emit red light, the emission layer 350 overlapping the green color filter 230G may emit green light, and the emission layer 350 overlapping the blue color filter 230B may emit blue light. The light blocking member 220 may be disposed between the respective color filters 230R, 230G, and 230B. According to an embodiment, the color filter layers 230R, 230G, and 230B may be replaced with a color conversion layer, or may include a color conversion layer. The color conversion layer may include a quantum dot.

An upper planarization layer 550 covering or overlapping the color filter layers 230R, 230G, and 230B may be disposed on the color filter layers 230R, 230G, and 230B. The upper planarization layer 550, which may be for planarizing an upper surface of the light emitting display device, may be an organic insulating layer including at least one material of a polyimide, a polyamide, an acrylic resin, benzocyclobutene, and a phenol resin.

Hereinafter, a pad portion 30 of the light emitting display device will be described based on a schematic cross-sectional view thereof in the non-display area NA with reference to FIG. 5 to FIG. 7.

Figure 5:
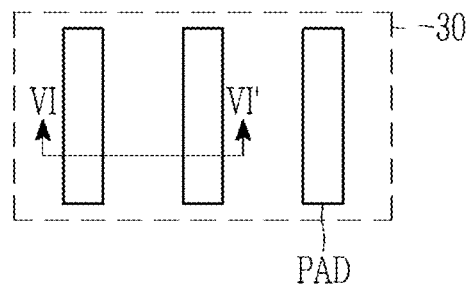
FIG. 5 illustrates a portion of a pad portion in a light emitting display device according to an embodiment.
Figure 6:
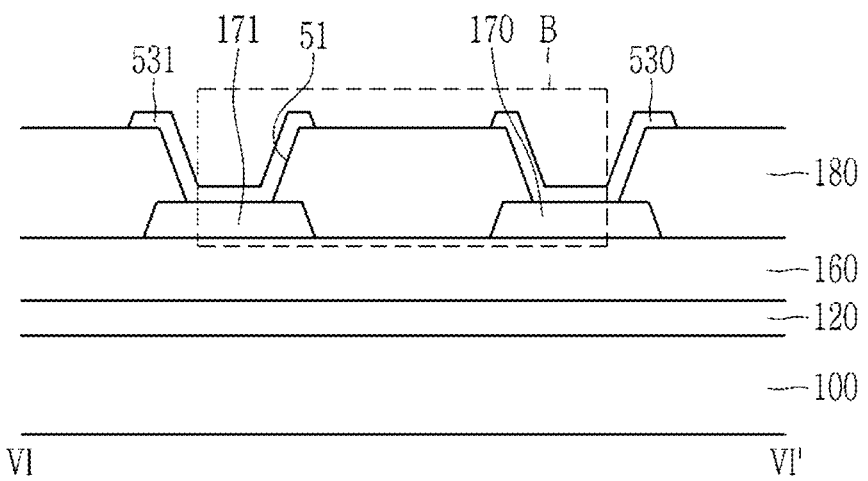
FIG. 6 illustrates a schematic cross-sectional view taken along a line VI-VI' of FIG. 5.
Figure 7:
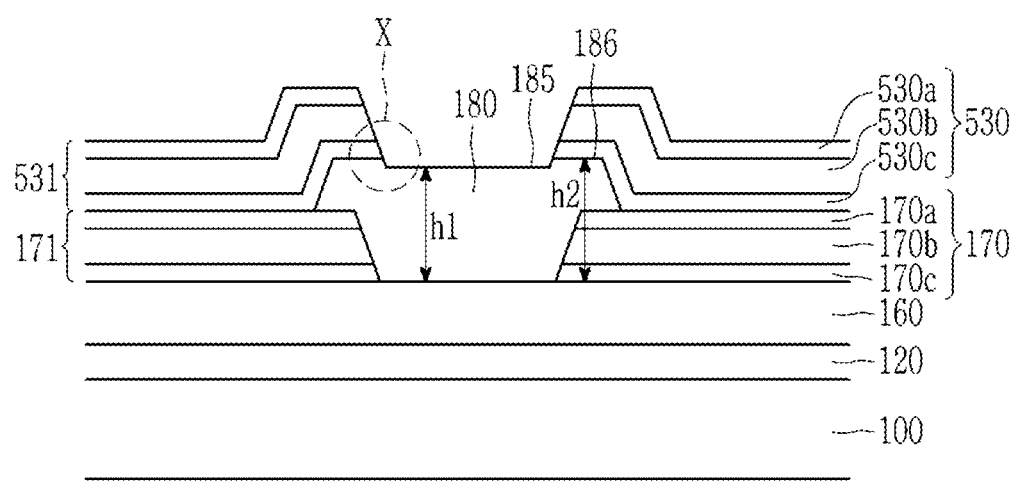
FIG. 7 illustrates a detailed view of a region B in FIG. 6.

FIG. 5 illustrates a portion of a pad portion in a light emitting display device according to an embodiment, FIG. 6 illustrates a schematic cross-sectional view taken along a line VI-VI' of FIG. 5, and FIG. 7 illustrate a detailed view of a region B in FIG. 6.

The pad portion 30 illustrated in FIG. 5 may correspond to the pad portion 30 of FIG. 1, and a stacking order of the light emitting display device illustrated in FIG. 6 and FIG. 7 may correspond to that of the light emitting display device of FIG. 3.

Referring to FIG. 5 to FIG. 7, the pad PAD may include lower pad electrodes 170 and 171 and upper pad electrodes 530 and 531.

The lower pad electrodes 170 and 171 may be disposed on the interlayer insulating layer 160. The lower pad electrodes 170 and 171 include a first lower pad electrode 170 and a second lower pad electrode 171 spaced apart from each other. The lower pad electrodes 170 and 171 may be disposed at a same layer as the source electrode 173 and the drain electrode 175 of FIG. 3, and may be formed by using a same or similar material and a same process. The lower pad electrodes 170 and 171 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof, and may be formed of a single layer or a multilayer.

In an embodiment, the lower pad electrodes 170 and 171 may be formed as a triple layer. In an embodiment, a first end of the lower pad electrodes 170 and 171 may have an inclined shape (tapered shape).

FIG. 7 illustrates the lower pad electrodes 170 and 171 formed as a triple layer including an upper layer 170a, an intermediate layer 170b, and a lower layer 170c. The upper layer 170a and the lower layer 170c of the lower pad electrodes 170 and 171 may include titanium (Ti), and the intermediate layer 170b may include aluminum (Al).

A lower planarization layer 180 may be disposed on the lower pad electrodes 170 and 171 to cover or overlap the lower pad electrodes 170 and 171 and the substrate 100. The lower planarization layer 180 may be disposed between the first lower pad electrode 170 and the second lower pad electrode 171 spaced apart from each other, to include an opening 51 (FIG. 6) to expose at least portions of the upper surface of the lower pad electrodes 170 and 171. The lower planarization layer 180 may be an organic insulating layer, and may include at least one material of a polyimide, a polyamide, an acrylic resin, benzocyclobutene, and a phenol resin. According to an embodiment, another organic insulating layer or inorganic insulating layer disposed above the source electrode 173 and the drain electrode 175 may be used instead of the lower planarization layer 180. As an example, a sensing insulating layer 510 may be used.

Upper pad electrodes 530 and 531 may be disposed on the lower pad electrodes 170 and 171. The upper pad electrodes 530, and 531 may be formed or disposed in the opening 51 (FIG. 6) of the lower planarization layer 180, and may overlap at least a portion of the upper surface of the lower planarization layer 180. The upper pad electrodes 530 and 531 may include a first upper pad electrode 530 and a second upper pad electrode 531 spaced apart from each other.

The upper pad electrodes 530 and 531 may be disposed at a same layer as the sensing electrodes 520 and 540 of FIG. 3, and may be formed by using a same or similar material and a same process. The upper pad electrodes 530 and 531 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof, and may be formed of a single layer or a multilayer.

The lower planarization layer 180 may include an opening 51 on which upper surfaces of the lower pad electrodes 170 and 171 may be exposed, and the upper pad electrodes 530 and 531 and the lower pad electrodes 170 and 171 may be physically and electrically connected to each other by the opening 51 of the lower planarization layer 180. An upper surface of the lower planarization layer 180 may be exposed to the outside, except for portions where the upper pad electrodes 530 and 531 and the lower pad electrodes 170 and 171 contact.

In an embodiment of FIG. 7, the upper pad electrodes 530 and 531 formed as a triple layer including an upper layer 530a, an intermediate layer 530b, and a lower layer 530c are illustrated. The upper layer 530a and the lower layer 530c of the upper pad electrodes 530 and 531 may include titanium (Ti), and the intermediate layer 530b may include aluminum (Al).

FIG. 7 illustrates the portion B of FIG. 6, and thus the lower planarization layer 180 illustrated in FIG. 7 corresponds to a portion of the lower planarization layer 180 disposed between the pad electrodes. The lower planarization layer 180 may include an exposed portion 185 exposing the upper surface of the lower planarization layer 180 and an overlapping portion 186 partially overlapping the upper pad electrodes 530 and 531.

In a case that a portion X of FIG. 7 is described, among the upper surfaces of the lower planarization layer 180, the upper surface of the overlapping portion 186 covered or overlapped by the upper pad electrodes 530 and 531 and the upper surface of the exposed portion 185 may have different heights. For example, a height h1 of the upper surface of the exposed portion 185 of the lower planarization layer 180 may be lower than a height h2 of the upper surface of the overlapped portion 186. The exposed portion 185 of the lower planarization layer 180 may be electrically connected to a pad of a flexible printed circuit board (FPCB).

A structure of the lower planarization layer 180 may be formed by a deposition process of the inorganic passivation layer 505 and a subsequent etching process, which may be added, to reduce damage of the upper pad electrodes 530 and 531.

Accordingly, the light emitting display device according to an embodiment may reduce damage of upper pad electrodes 530 and 531 that may occur in a subsequent process such as a color filter forming process by forming the upper pad electrodes 530 and 531 and depositing the inorganic passivation layer 505 on the upper pad electrodes 530 and 531.

Hereinafter, a manufacturing method for reducing a problem that a height of the lower planarization layer 180 of FIG. 7 may vary and damage that may occur in the upper pad electrodes 530 and 531 will be described in detail with reference to FIG. 8 to FIG. 11.

FIG. 8 to FIG. 11 schematically illustrate a manufacturing method of a pad in a manufacturing method of a light emitting display device according to an embodiment.

FIG. 8 to FIG. 11 may correspond to the non-display area of the light emitting display device described with reference to FIG. 7.

Figure 8:
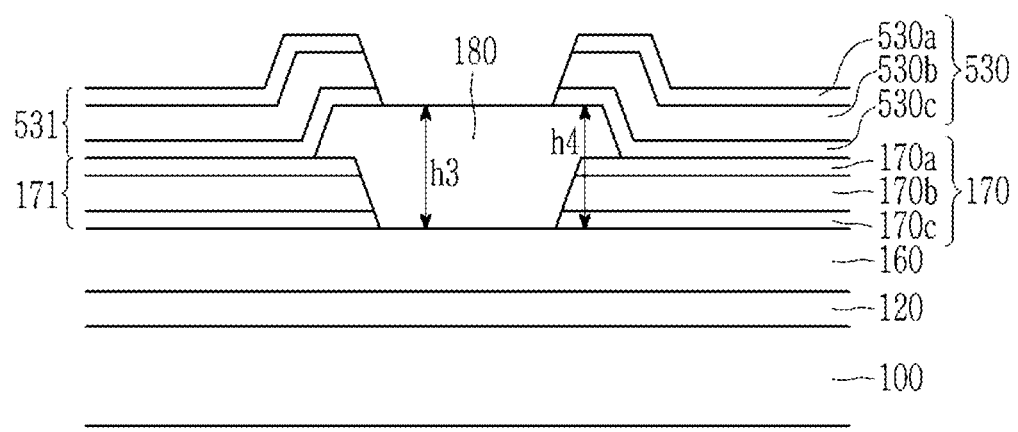
FIG. 8 to FIG. 11 schematically illustrate a manufacturing method of a pad in a manufacturing method of a light emitting display device according to an embodiment.

Referring to FIG. 8, a light emitting display device in which the gate insulating layer 120 and the interlayer insulating layer 160 may be sequentially stacked on the substrate 100 in a non-display area NA is provided.

Referring back to FIG. 3, the gate insulating layer 120 and the interlayer insulating layer 160 may be sequentially disposed on the substrate 100 in the display area DA.

The lower pad electrodes 170 and 171 of the non-display area NA may be formed by using the same or similar material and the same method at the same layer as the source electrode 173 and the drain electrode 175 of the display area DA. For example, in a case that the source electrode 173 and the drain electrode 175 may be disposed on the interlayer insulating layer 160 in the display area DA, the lower pad electrodes 170 and 171 may be disposed on the interlayer insulating layer 160 in the non-display area NA. In an embodiment, the source electrode 173, the drain electrode 175, and the lower pad electrodes 170 and 171 may have a same triple layer structure.

Thereafter, the lower planarization layer 180 covering or overlapping the source electrode 173, the drain electrode 175, and the lower pad electrodes 170 and 171 may be disposed thereon. An etching process may be performed on the formed lower planarization layer 180 to form an opening. The opening formed in the lower planarization layer 180 may include the opening 51 exposing at least a portion of the lower pad electrodes 170 and 171.

Thereafter, a process of forming the upper pad electrodes 530 and 531 may be performed on the pad portion 30 of the non-display area NA. The upper pad electrodes 530 and 531 of the non-display area NA may be formed by using the same or similar material and the same process at the same layer as the sensing electrodes 520 and 540 of the display area DA. For example, in a case that the sensing electrodes 520 and 540 may be formed or disposed in the display area DA, the upper pad electrodes 530 and 531 may be disposed on the lower planarization layer 180 in the pad portion 30 of the non-display area NA. A process of forming layers in the display area DA between the process of forming the lower planarization layer 180 and the process of forming the sensing electrodes 520 and 540 may be included, and in the pad portion 30 of the non-display area NA, such a process may not be performed, or corresponding layers may be removed by etching after they may be formed.

In the non-display area NA, the lower planarization layer 180 disposed between the upper pad electrodes 530 and 531 and the lower pad electrodes 170 and 171 may be formed by using the same or similar material and the same process as the lower planarization layer 180 of the display area DA. The lower planarization layer 180 may be formed or disposed over the display area DA and the non-display area NA.

As illustrated in FIG. 8, the lower planarization layer 180 disposed between the lower pad electrodes 170 and 171 may have a constant height of an upper surface thereof up to the process that forms the upper pad electrodes 530 and 531. For example, a height h4 of the upper surface of the overlapping portion 186 of the lower planarization layer 180 overlapping the upper pad electrodes 530 and 531 and a height h3 of the upper surface of the exposed portion 185 of the lower planarization layer 180, where it is exposed, may be the same. However, according to an embodiment, in a case that the upper pad electrodes 530 and 531 may be etched, the exposed portion 185 of the lower planarization layer 180 may be partially etched to have a low height.

Figure 9:
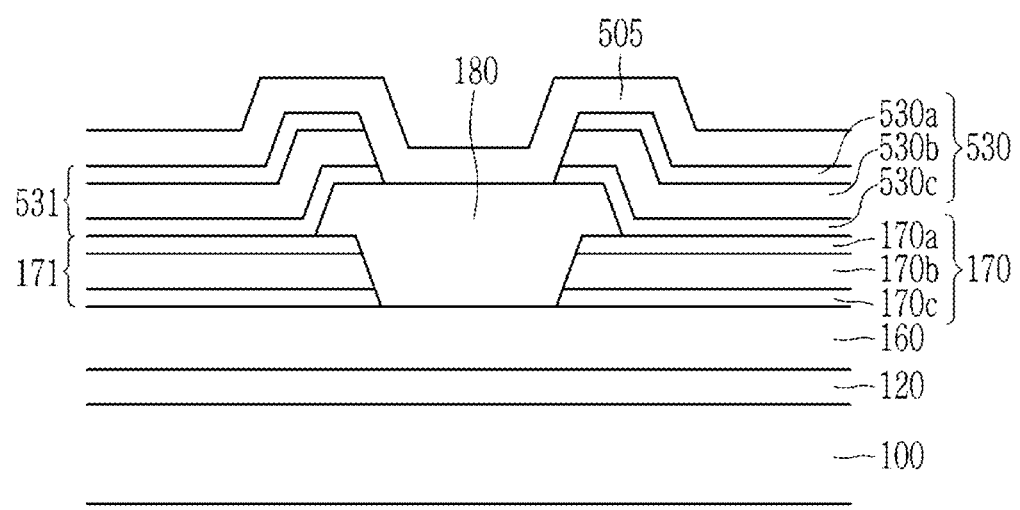

Referring to FIG. 9, an inorganic passivation layer 505 may be disposed on the upper pad electrodes 530 and 531 and the lower planarization layer 180 to cover or overlap the upper pad electrodes 530 and 531 and the lower planarization layer 180. The inorganic passivation layer 505 may also cover or overlap the sensing electrodes 520 and 540 of the display area DA to be disposed over the display area DA and the non-display area NA.

Referring back to FIG. 3, in the display area DA, a process of forming the light blocking member 220 and the color filter layers 230R, 230G, and 230B on the inorganic passivation layer 505 may be performed after forming the inorganic passivation layer 505, and then, a process of forming the upper planarization layer 550 on the color filter layers 230R, 230G, and 230B may also be performed. However, since the light blocking member 220, the color filter layers 230R, 230G, and 230B, and the upper planarization layer 550 may not be formed or disposed in the pad portion 30 of the non-display area NA, the inorganic passivation layer 505 may be maintained at a top position as illustrated in FIG. 9. The inorganic passivation layer 505 protects the upper pad electrodes 530 and 531 in a process of forming and removing the light blocking member 220, the color filter layers 230R, 230G, and 230B, and the upper planarization layer 550.

The upper pad electrodes 530 and 531 may be required to be electrically connected to pads of the flexible printed circuit board (FPCB), and thus should be exposed to the outside. Therefore, a process of removing the inorganic passivation layer 505 may be required to be further performed.

Figure 10:
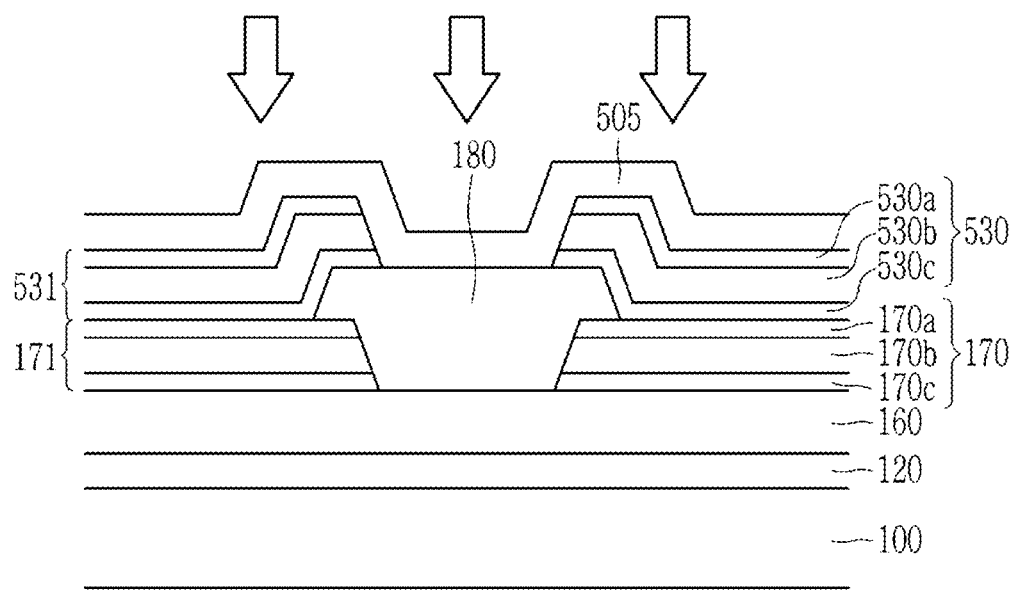

Referring to FIG. 10, an etching process is performed to expose the upper pad electrodes 530 and 531. Herein, the etching process uses a dry etch process. The dry etch process may be performed in a vacuum chamber, and the inorganic passivation layer 505 may be removed using an etching gas such as argon (Ar), chlorine ($Cl_2$), or oxygen ($O_2$).

The inorganic passivation layer 505 in the non-display area NA may be removed by the dry etch process. On the other hand, in the display area DA, a layer disposed at a lower portion of the upper planarization layer 550 is not etched because it is protected by the upper planarization layer 550 including the organic insulating material. Accordingly, as illustrated in FIG. 3 and FIG. 4, the inorganic passivation layer 505 may remain on the sensing electrodes 520 and 540 in the display area.

Figure 11:
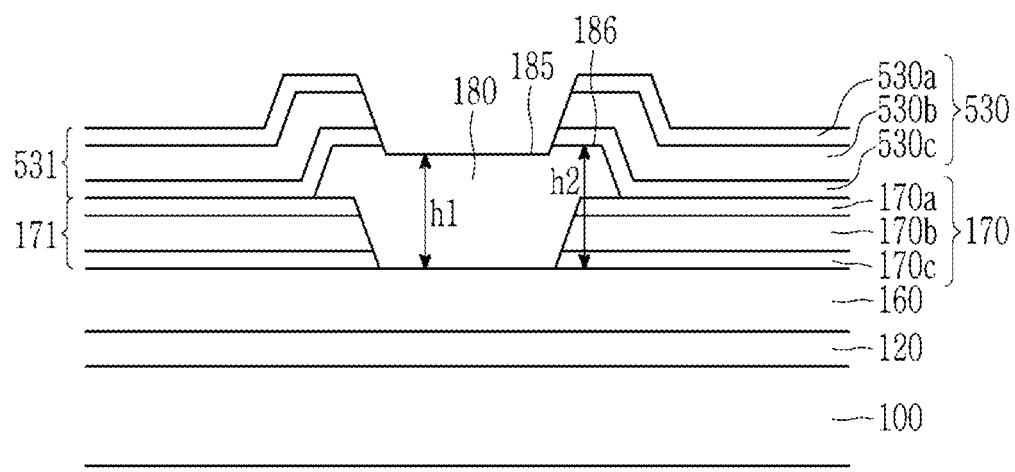

Referring to FIG. 11, an inorganic passivation layer 505 is removed on the upper pad electrodes 530 and 531 by the dry etch process, and the upper surface of the lower planarization layer 180 disposed between the lower pad electrodes 170 and 171 is exposed. A pad or the like of the flexible printed circuit board (FPCB) may be attached to the exposed upper pad electrodes 530 and 531 to apply a voltage from the outside.

The upper surface of the exposed portion 185 of the lower planarization layer 180, at which it is exposed, may have a different height from that of the upper surface of the overlapping portion 186 covered or overlapped by the upper pad electrodes 530 and 531 by the dry etch process. For example, the height h1 of the exposed portion 185 of the lower planarization layer 180 may be lower than the height h2 of the overlapped portion 186. The structure of the lower planarization layer 180 may be formed in a process of removing the inorganic passivation layer 505 that may be added to reduce the damage of the upper pad electrodes 530 and 531. According to an embodiment, in a case that etching is performed to complete the upper pad electrodes 530 and 531, the exposed portion 185 of the lower planarization layer 180 is first etched, and then is second etched in the process of removing the inorganic passivation layer 505, thereby leading to a low height.

Accordingly, the light emitting display device according to an embodiment may reduce damage of upper pad electrodes 530 and 531 that may occur in a color filter forming process by forming the upper pad electrodes 530 and 531 and depositing the inorganic passivation layer 505 on the upper pad electrodes 530 and 531.

The embodiment of FIG. 3 in which there is no buffer layer between the sensor and the encapsulation layer 400, i.e., between the sensing electrode connector 541, the sensing insulating layer 510, and the encapsulation layer 400, has been described.

However, according to an embodiment, a buffer layer 501 may be included between the sensor and the encapsulation layer 400, and an embodiment including the buffer layer 501 will be described with reference to FIG. 12.

Figure 12:
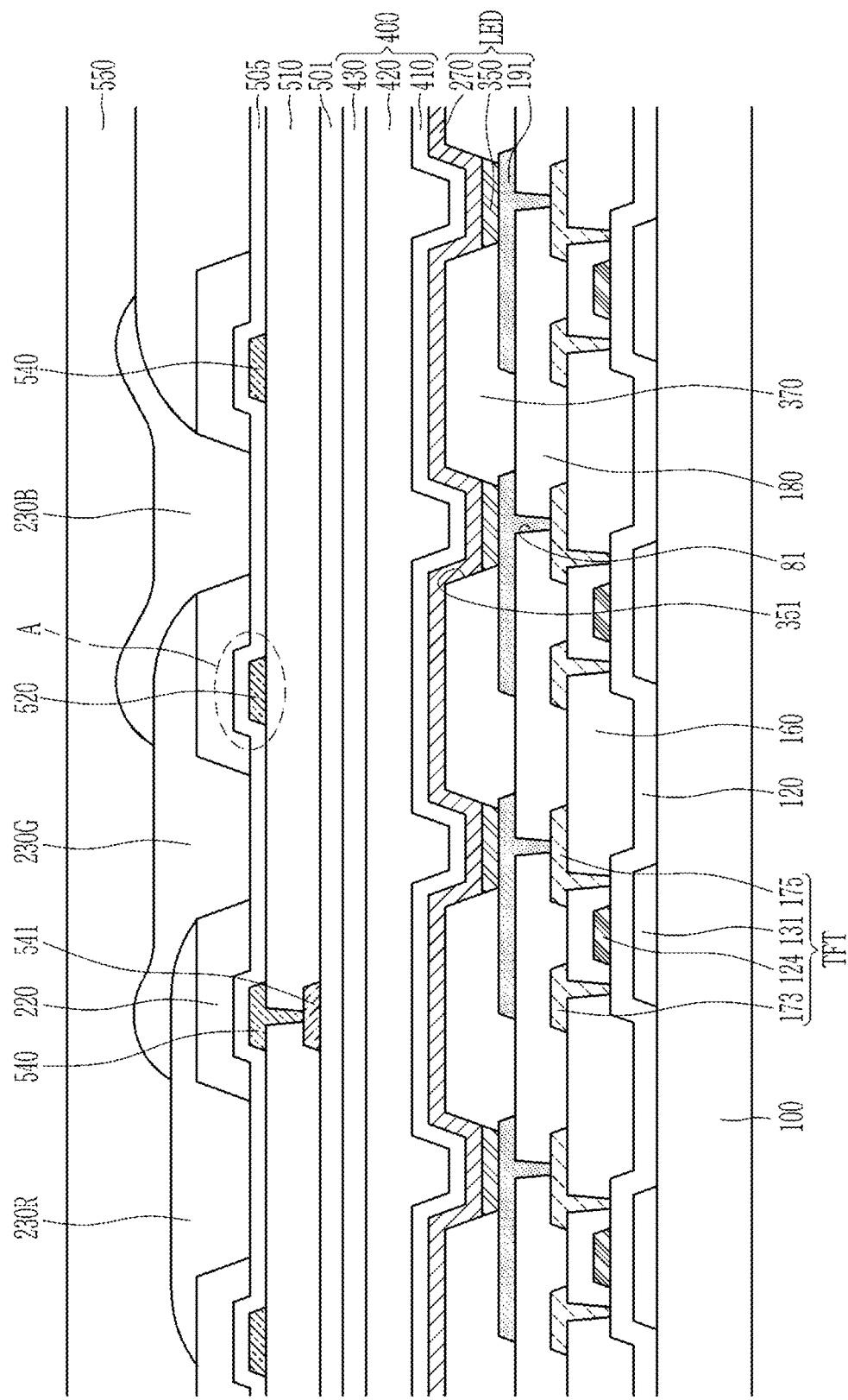
FIG. 12 illustrates a schematic cross-sectional view showing a portion of a display area in a light emitting display device according to an embodiment.

FIG. 12 illustrates a schematic cross-sectional view showing a portion of a display area in a light emitting display device according to an embodiment.

FIG. 12 may be generally the same as FIG. 3, but may differ in that the buffer layer 501 may be disposed on the encapsulation layer 400.

The buffer layer 501 may be formed of an inorganic insulating layer, and an inorganic material included in the inorganic insulating layer may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride.

A sensing insulating layer 510, a sensing electrode connector 541, and sensing electrodes 520 and 540 may be disposed on the buffer layer 501.

Even in an embodiment of FIG. 12, the source electrode 173 and the drain electrode 175 may be a triple layer including an upper layer, an intermediate layer, and a lower layer, the upper layer and the lower layer may include titanium (Ti), and the intermediate layer may include aluminum (Al). The sensing electrodes 520 and 540 may be a triple layer including an upper layer, an intermediate layer, and a lower layer, the upper layer and the lower layer may include titanium (Ti), and the intermediate layer may include aluminum (Al).

As illustrated in FIG. 12, the layer structure of the pad portion 30 may be changed due to the buffer layer 501 formed or disposed in the display area TA, which will be described with reference to FIG. 13.

Figure 13:
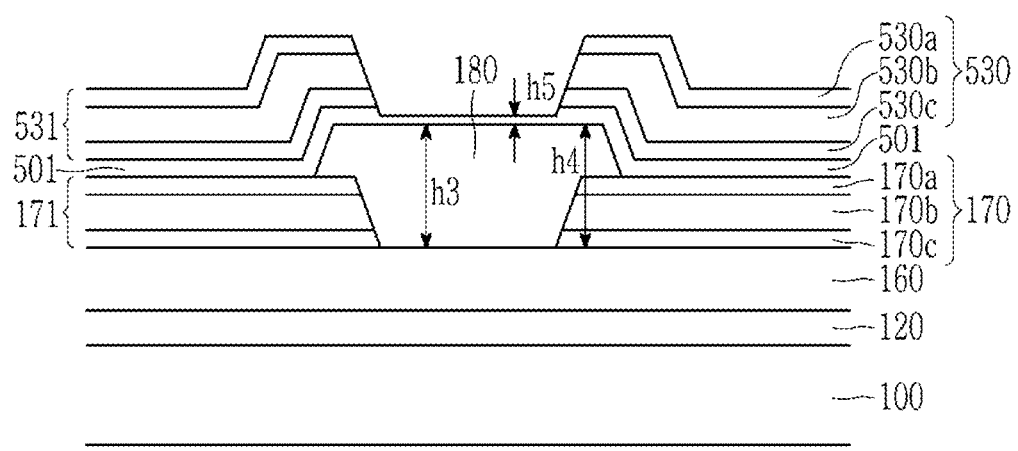
FIG. 13 illustrates a schematic cross-sectional view showing a portion of a pad in a light emitting display device according to an embodiment.

FIG. 13 illustrates a schematic cross-sectional view showing a portion of a pad in a light emitting display device according to an embodiment.

A structure of FIG. 13 may be different from that of FIG. 7 in that the buffer layer 501 may be included. According to FIG. 13, an exposed portion of the buffer layer 501 may have a thinner thickness h5 than a portion covered or overlapped by the upper pad electrodes 530 and 531.

The thickness difference of the buffer layer 501 may be caused by partially etching the upper surface of the buffer layer 501, where it may be exposed, during the process of removing the inorganic passivation layer 505 formed to protect the upper pad electrodes 530 and 531.

Although it is illustrated in FIG. 13 that the buffer layer 501 may be disposed between the lower pad electrode 170 and the upper pad electrode 530 to not be electrically connected to each other, an opening may be formed in the buffer layer 501 to electrically connect the lower pad electrode 170 and the upper pad electrode 530 in a portion that is not illustrated in FIG. 13. This is because the lower pad electrode 170 and the upper pad electrode 530 may be required to be electrically connected to each other in order to form the pad.

The height of the upper surface of the lower planarization layer 180 may be constant according to an embodiment. For example, a height h4 of the upper surface of the overlapping portion 186 of the lower planarization layer 180 overlapping the upper pad electrodes 530 and 531 and a height h3 of the upper surface of the exposed portion 185 of the lower planarization layer 180, where it may be exposed, may be the same.

Hereinafter, pad structures according to an example and a comparative example of FIG. 13 will be compared and described with reference to FIG. 14A to FIG. 15B.

Figure 14A:
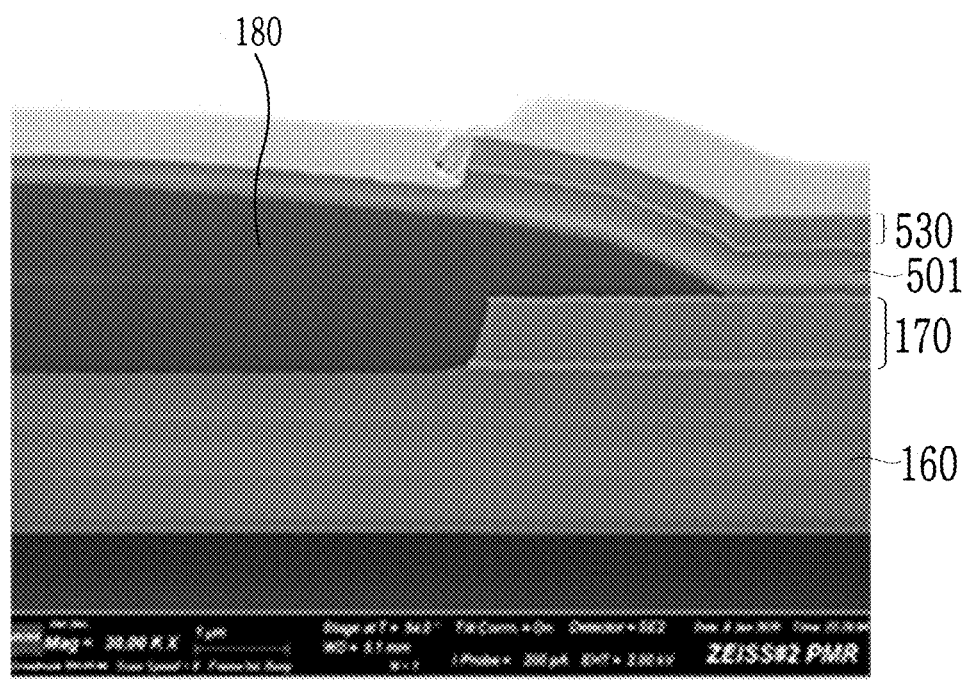
FIG. 14A and FIG. 14B illustrate scanning electron microscope images of an image of a portion of a pad that is cut off in a light emitting display device according to an example.
Figure 14B:
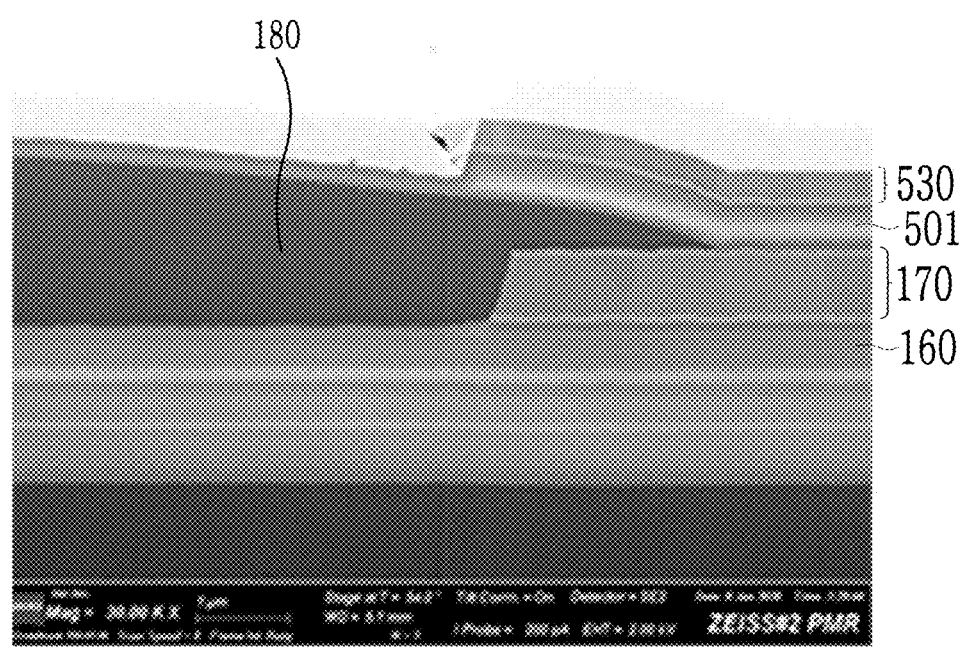
Figure 15A:
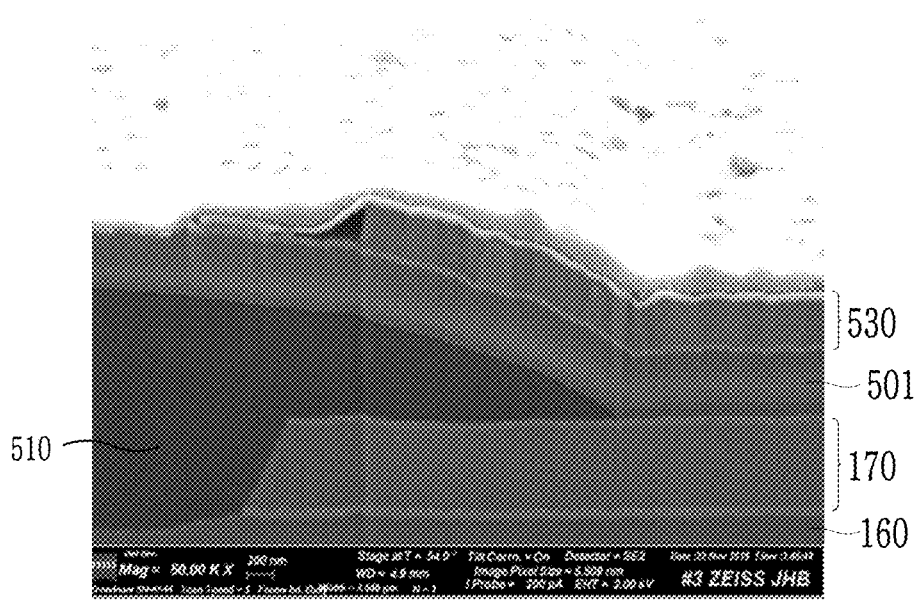
FIG. 15A and FIG. 15B illustrate a scanning electron microscope images of an image of a portion of a pad that is cut off in a light emitting display device according to a comparative example.
Figure 15B:
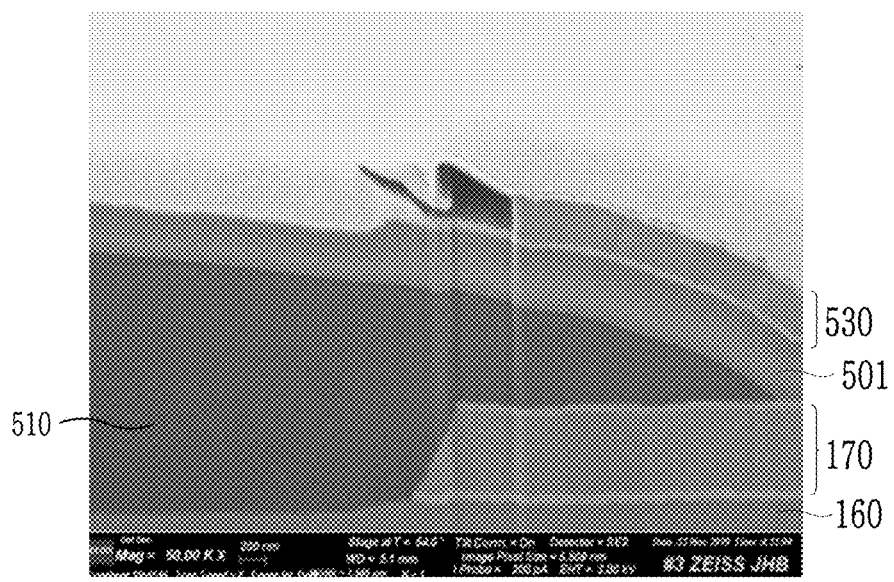

FIG. 14A and FIG. 14B illustrate scanning electron microscope images of an image of a portion of a pad that may be cut off in a light emitting display device according to an example, and FIG. 15A and FIG. 15B illustrate scanning electron microscope images of an image of a portion of a pad that may be cut off in a light emitting display device according to a comparative example.

In FIG. 14A to FIG. 15B, a layer of a bright color is illustrated on top of the upper pad electrode 530, which may be a coating layer that may be additionally coated to photograph an image as illustrated in FIG. 14A to FIG. 15B, and in fact, the upper pad electrode 530 has a structure that may be exposed to be electrically connected to another pad.

For FIG. 14A to FIG. 15B, the interlayer insulating layer 160, the lower pad electrode 170, the lower planarization layer 180, the buffer layer 501, and the upper pad electrode 530, disposed in the non-display area in the light emitting display device according to the example and the comparative example of FIG. 13, are partially illustrated.

The lower planarization layer 180 is positioned between the adjacent lower pad electrode 170 and the adjacent upper pad electrode 530, and the lower pad electrode 170 and the upper pad electrode 530 may be each formed as a triple layer.

The upper pad electrode 530 and the lower pad electrode 170 may be a triple layer formed to include a titanium (Ti)

layer, an aluminum (Al) layer, and a titanium (Ti) layer, i.e., upper and lower titanium (Ti) layers which may be thinly colored in a light color, and thickly and darkly marked aluminum (Al) layers between them.

The interlayer insulating layer 160 may be disposed at a lower portion of the lower pad electrode 170, and the buffer layer 501 may be disposed in a portion of a region between the lower pad electrode 170 and the upper pad electrode 530.

The interlayer insulating layer 160 may be entirely formed or disposed in the display area DA and the non-display area NA.

The buffer layer 501 is illustrated as being disposed between the lower pad electrode 170 and the upper pad electrode 530, but may be disposed at a portion of the pad, and the lower pad electrode 170 and the upper pad electrode 530 may directly contact each other at a portion extending to a right side of FIG. 14A and FIG. 14B. For example, the lower pad electrode 170 and the upper pad electrode 530 may be required to be electrically connected to each other, and thus, although not illustrated in FIG. 14A to FIG. 15B, an opening may be formed in the buffer layer 501 so that the lower pad electrode 170 and the upper pad electrode 530 may be electrically connected to each other.

Referring to FIG. 14A and FIG. 14B, it may be seen that the upper surface of the upper pad electrode 530 is maintained to have a smooth surface, and thus it may be seen that there is no damage to the upper pad electrode 530 according to an embodiment. This is because the upper pad electrodes 530 and 531 may be protected in a subsequent process by the inorganic passivation layer 505 disposed on the upper pad electrodes 530 and 531. Therefore, in an embodiment, even in a case that a process of forming the light blocking member 220 and the color filter layers 230R, 230G, and 230B is performed, the upper pad electrode 530 may be protected.

On the other hand, according to the comparative example illustrated in FIG. 15A and FIG. 15B, the inorganic passivation layer 505 disposed on the upper pad electrodes 530 and 531 may not be formed unlike in FIG. 14A and FIG. 14B, and thus, the upper pad electrodes 530 and 531 may be exposed during the process of forming the light blocking member 220 and the color filter layers 230R, 230G, and 230B on the upper pad electrodes 530 and 531.

Accordingly, in the comparative example illustrated in FIG. 15A and FIG. 15B, the upper pad electrode 530 is damaged in the process of forming the light blocking member 220 and the color filter layers 230R, 230G, and 230B on the sensing electrodes 520 and 540 after forming the upper pad electrodes 530 and 531 in the non-display area and the sensing electrodes 520 and 540 in the display area.

Referring to FIG. 15A and FIG. 15B, it may be seen that the upper surface of the upper pad electrode 530 is damaged, so that it does not have a smooth surface. Damage such as excitation or tip generation may occur in the upper layer of the upper pad electrode 530, a metal in the intermediate layer may be eroded, and contact performance of the pad electrode may be deteriorated. For example, the upper layer and the lower layer of the upper pad electrode 530 according to the comparative example may include titanium (Ti), the intermediate layer may include aluminum (Al), and aluminum (Al) may be eroded as titanium (Ti) is damaged.

On the other hand, referring to FIG. 14A and FIG. 14B, in the light emitting display device according to an embodiment, the metal layer of the upper pad electrode 530 may be protected during the process by the inorganic passivation layer 505, so the performance of the pad electrode may also be maintained.

Hereinafter, a schematic cross-sectional structure of the pad portion 30 that may be different from that of FIG. 13 will be further described in an embodiment in which the buffer layer 501 may be disposed on the encapsulation layer 400 as illustrated in FIG. 12.

Figure 16:
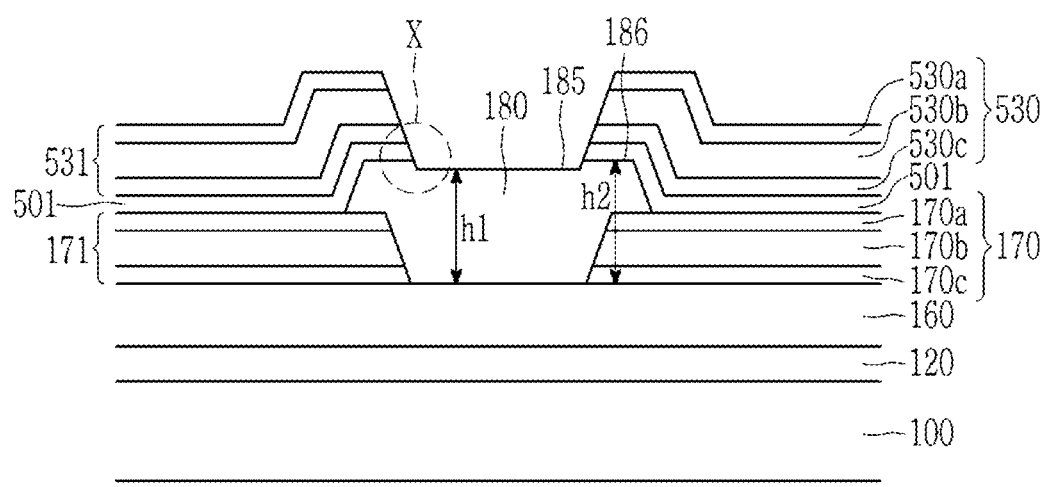
FIG. 16 and FIG. 17 illustrate schematic cross-sectional views showing a portion of a pad in a light emitting display device according to an embodiment.
Figure 17:
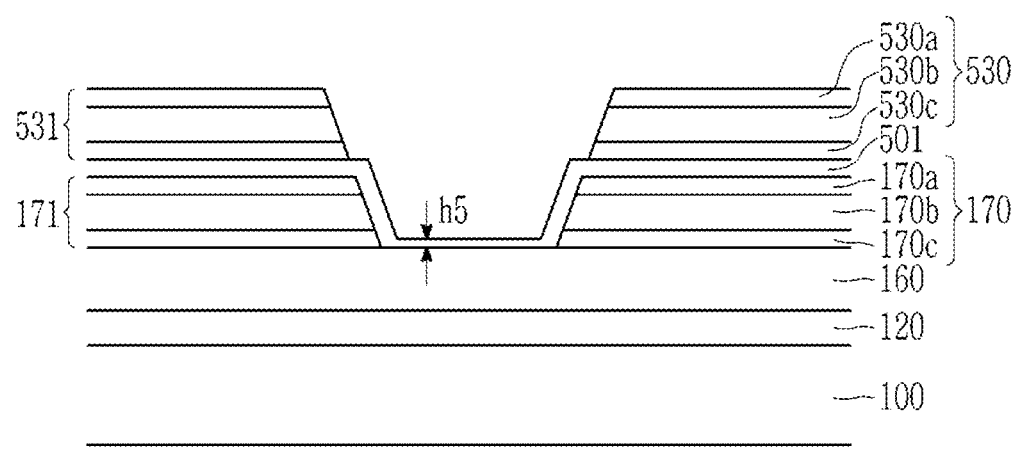

FIG. 16 and FIG. 17 illustrate schematic cross-sectional views showing a portion of a pad in a light emitting display device according to an embodiment.

First, unlike in FIG. 13, in FIG. 16, a structure in which the lower planarization layer 180 is exposed while the buffer layer 501 that may be exposed between the upper pad electrodes 530 and 531 is etched is illustrated. In this case, the upper surface of the lower planarization layer 180 may be additionally etched. For example, in a case that a portion X of FIG. 16 is described, among the upper surfaces of the lower planarization layer 180, the upper surface of the overlapping portion 186 covered or overlapped by the upper pad electrodes 530 and 531 and the upper surface of the exposed portion 185 may have different heights. A height h1 of the upper surface of the exposed portion 185 of the lower planarization layer 180 may be lower than a height h2 of the upper surface of the overlapped portion 186.

In an embodiment of FIG. 16, the inorganic passivation layer 505 may be formed or disposed on the upper pad electrodes 530 and 531, to reduce damage of the upper pad electrodes 530 and 531 that may occur in a subsequent process such as a color filter forming process.

Meanwhile, according to an embodiment, the pad portion 30 may not be included between the pad electrodes in the pad portion 30. In a case that the lower planarization layer 180 may be disposed between the pad electrodes, it is good to eliminate a problem of being electrically short-circuited between adjacent pad electrodes, but there may be a problem that the gap between adjacent pad electrodes may not be reduced to a certain or predetermined level or less. For example, as the resolution increases, the gap between the pad electrodes in the pad portion 30 needs to be reduced, so that the pad portion 30 excluding the lower planarization layer 180 may also be formed.

Hereinafter, a schematic cross-sectional structure of the pad portion excluding the lower planarization layer 180 between the pad electrodes will be described with reference to FIG. 17.

According to FIG. 17, the lower pad electrodes 170 and 171 and the upper pad electrodes 530 and 531 each formed as a triple layer may be formed or disposed on the interlayer insulating layer 160, and the buffer layer 501 may be formed or disposed between the lower pad electrodes 170 and 171 and the upper pad electrodes 530 and 531.

The buffer layer 501 may be formed or disposed on the upper surfaces of the lower pad electrodes 170 and 171 and tapered side surfaces thereof, and may also be disposed on the interlayer insulating layer 160, where it is exposed. However, a portion positioned on the interlayer insulating layer 160, where it may be exposed, may have a thickness h5 that may be thinner than that of other portions. This is because the buffer layer 501 may be partially etched while performing etching to remove the inorganic passivation layer 505 formed or disposed to protect the upper pad electrodes 530 and 531 from damage.

Accordingly, the light emitting display device according to an embodiment of FIG. 17 may reduce damage of upper pad electrodes 530 and 531 that may occur in a subsequent process such as a color filter forming process by forming the upper pad electrodes 530 and 531 and depositing the inorganic passivation layer 505 on the upper pad electrodes 530 and 531.

Although it is illustrated in FIG. 17 that the buffer layer 501 may be disposed between the lower pad electrode 170 and the upper pad electrode 530 to not be electrically connected to each other, an opening may be formed in the buffer layer 501 to electrically connect the lower pad electrode 170 and the upper pad electrode 530 in a portion that is not illustrated in FIG. 17. This is because the lower pad electrode 170 and the upper pad electrode 530 may be required to be electrically connected to each other in order to form the pad.

Meanwhile, according to an embodiment, unlike in FIG. 17, the buffer layer 501 may not be disposed between pad electrodes. For example, the buffer layer 501 exposed between the pad electrodes in the process of etching the inorganic passivation layer 505 may also be etched. In this case, the exposed portion of the interlayer insulating layer 160 disposed at a lower portion of the inorganic passivation layer 505 may be additionally etched.

Hereinafter, a schematic cross-sectional structure of the pad portion according to an embodiment of FIG. 18 will be described.

Figure 18:
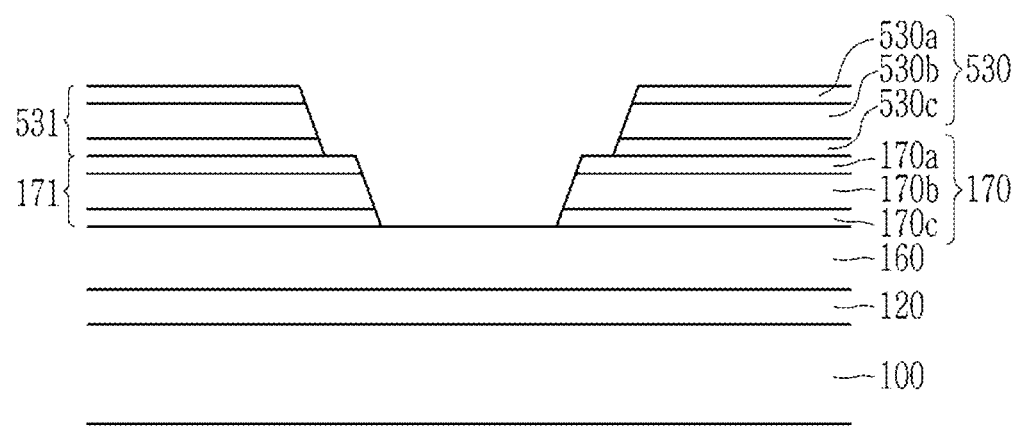
FIG. 18 illustrates a schematic cross-sectional view showing a portion of a pad in a light emitting display device according to an embodiment.

FIG. 18 illustrates a schematic cross-sectional view showing a portion of a pad in a light emitting display device according to an embodiment.

In an embodiment of FIG. 18, the lower planarization layer 180 is not included between the pad electrodes, and unlike in FIG. 17, the buffer layer 501 may also not be included.

In an embodiment of FIG. 18, since the lower planarization layer 180 is not included, a gap between adjacent pad electrodes as in FIG. 17 may be reduced. The buffer layer 501 may not be formed or disposed between the lower pad electrodes 170 and 171 and the upper pad electrodes 530 and 531, and thus even in a case that the opening is not formed by using a mask on the buffer layer 501, the lower pad electrodes 170 and 171 and the upper pad electrodes 530 and 531 may be directly electrically connected.

In an embodiment of FIG. 18, damage of the upper pad electrodes 530 and 531 may be reduced by depositing the inorganic passivation layer 505 on the upper pad electrodes 530 and 531 and performing a subsequent process, such as a color filter forming process, in a state where the upper pad electrodes 530 and 531 may be protected.

In the process of removing the inorganic passivation layer 505, the exposed portion of the interlayer insulating layer 160 may be additionally etched.

Figure 19:
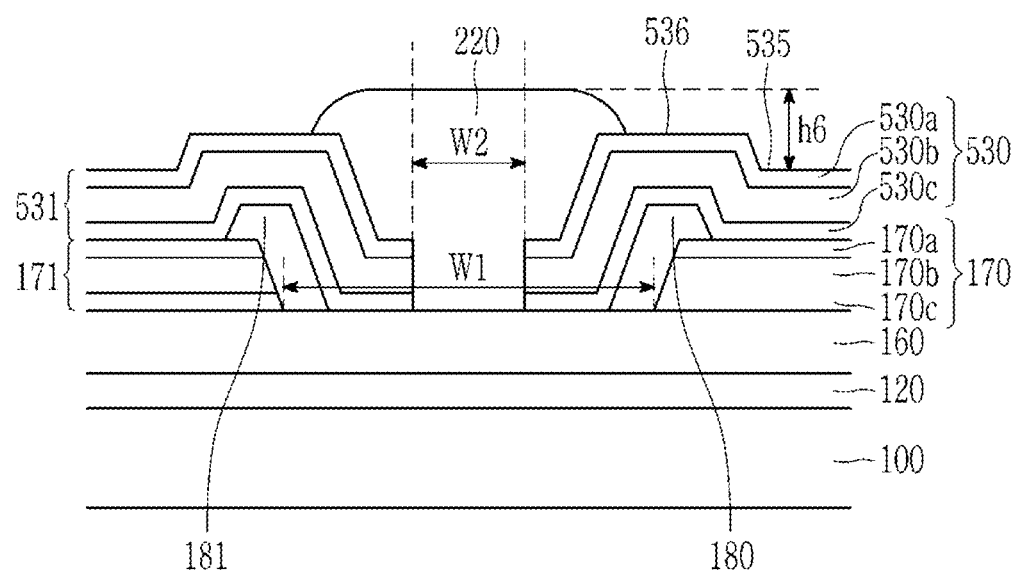
FIG. 19 illustrates a schematic cross-sectional view showing a portion of a pad in a light emitting display device according to an embodiment.

Meanwhile, an additional insulating layer may be disposed on the exposed interlayer insulating layer 160 of FIG. 18, and as an example, as illustrated in FIG. 19, the light blocking member 220 may be disposed.

A schematic cross-sectional structure of the display area DA corresponding to an embodiment of FIG. 18 may be the same as that of FIG. 3.

Hereinafter, a structure of a pad and a manufacturing method thereof in a light emitting display device according to an embodiment will be described with reference to FIG. 19 to FIG. 23.

FIG. 19 illustrates a schematic cross-sectional view showing a portion of a pad in a light emitting display device according to an embodiment, and FIG. 20 to FIG. 23 schematically illustrate a manufacturing method of a pad in a manufacturing method of a light emitting display device according to an embodiment.

FIG. 19 to FIG. 23 may be similar to FIG. 7 to FIG. 11, and thus a following description will focus on differences. A structure illustrated in FIG. 19 to FIG. 23 may correspond to a region B described with reference to FIG. 6.

Referring to FIG. 19, a first pad electrode and a second pad electrode that may be spaced apart from each other may be disposed on the interlayer insulating layer 160. The first pad electrode may include a first lower pad electrode 170 and a first upper pad electrode 530, and the second pad electrode may include a second lower pad electrode 171 and a second upper pad electrode 531.

A distance W1 from a first end of the first lower pad electrode 170 to a first end of the second lower pad electrode 171 may be in a range of about 10 μm to about 20 μm. By way of example, a distance W1 from a first end of the first lower pad electrode 170 to a first end of the second lower pad electrode 171 may be about 15 μm.

The lower pad electrodes 170 and 171 may be formed as a triple layer. The upper layer 170a and the lower layer 170c of the lower pad electrodes 170 and 171 may include titanium (Ti), and the intermediate layer 170b may include aluminum (Al).

Lower planarization layers 180 and 181 may be disposed on the lower pad electrodes 170 and 171. The lower planarization layers 180 and 181 may be positioned or disposed to at least partially overlap the lower pad electrodes 170 and 171 that may be spaced apart from each other, and have a structure covering or overlapping first ends of the lower pad electrodes 170 and 171. The lower planarization layers 180 and 181 may include a first lower planarization layer 180 and a second lower planarization layer 181 which may be spaced apart from each other. For example, the first lower planarization layer 180 may be disposed between the first lower pad electrode 170 and the first upper pad electrode 530 to partially cover or overlap the first lower pad electrode 170, and the second lower planarization layer 181 may be disposed between the second lower pad electrode 171 and the second upper pad electrode 531 to partially cover or overlap the lower pad electrode 171.

Upper pad electrodes 530 and 531 may be disposed on the lower pad electrodes 170 and 171 and the lower planarization layers 180 and 181. The upper pad electrodes 530 and 531 include a first upper pad electrode 530 and a second upper pad electrode 531 spaced apart from each other.

The upper pad electrodes 530 and 531 may be disposed to at least partially overlap the lower pad electrodes 170 and 171 and the lower planarization layers 180 and 181. The upper layer 530a and the lower layer 530c of the upper pad electrodes 530 and 531 may include titanium (Ti), and the intermediate layer 530b may include aluminum (Al).

Each of the upper pad electrodes 530 and 531 may include a flat portion 535 that may be in direct contact with the lower pad electrodes 170 and 171 and a convex portion 536 that may be in direct contact with the lower planarization layers 180 and 181.

A distance W2 from a first end of the first upper pad electrode 530 to a first end of the second upper pad electrode 531 may be about 10 μm or less. By way of example, a distance W2 from a first end of the first upper pad electrode 530 to a first end of the second upper pad electrode 531 may be about 5 μm. The greater the distance between neighboring upper pad electrodes 530 and 531, the lower the resolution of the light emitting display device may be, and the smaller the distance between neighboring upper pad electrodes 530 and 531, the higher the resolution of the light emitting display device. A step difference between the pads may be reduced by not matching first ends of the upper pad electrodes 530 and 531 with first ends of the lower pad electrodes 170 and 171.

The light blocking member 220 may be disposed between the first upper pad electrode 530 and the second upper pad electrode 531. Referring to FIG. 5 again, the light blocking member 220 may be disposed between neighboring pad electrodes.

The light blocking member 220 may be disposed to cover or overlap portions of the first upper pad electrode 530 and the second upper pad electrode 531, and the light blocking member 220 may be disposed to contact first ends of the upper pad electrodes 530 and 531. An upper surface of the light blocking member 220 may be disposed to be higher than the upper surface of the flat portion 535 of the upper pad electrodes 530 and 531 by about 0.7 μm (h6 in FIG. 19).

Accordingly, in the light emitting display device according to an embodiment, end portions of the upper pad electrodes 530 and 531 may be protected by the light blocking member 220, and thus the upper pad electrodes 530 and 531 may be formed, such that damage of the upper pad electrodes 530 and 531 that may occur in the color filter forming process may be reduced. Therefore, in an embodiment of FIG. 19, the inorganic passivation layer 505 may not be deposited on the upper pad electrodes 530 and 531. However, according to an embodiment, the inorganic passivation film 505 may be deposited on the upper pad electrodes 530 and 531, and in this case, an inorganic passivation layer 505 may be formed or disposed at a lower portion of the light blocking member 220 of FIG. 19.

Hereinafter, a method of manufacturing a pad structure of FIG. 19 will be sequentially described through FIG. 20 to FIG. 23.

Figure 20:
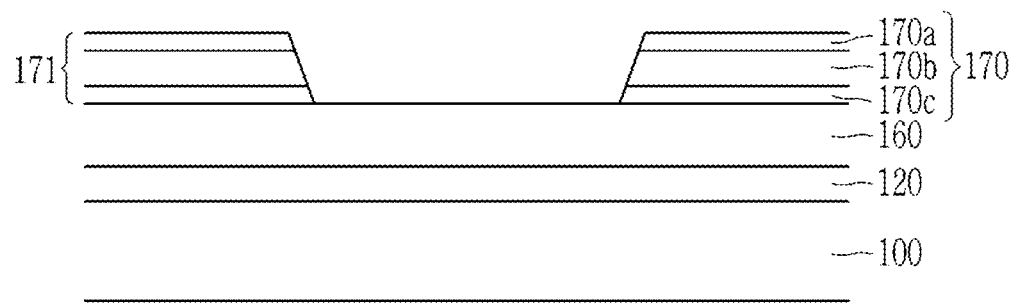
FIG. 20 to FIG. 23 schematically illustrate a manufacturing method of a pad in a manufacturing method of a light emitting display device according to an embodiment.

Referring to FIG. 20, the gate insulating layer 120 and the interlayer insulating layer 160 may be sequentially stacked on the non-display area NA of the substrate 100.

The first lower pad electrode 170 and the second lower pad electrode 171 may be spaced apart on the interlayer insulating layer 160. In a case that the source electrode 173 and the drain electrode 175 may be disposed on the interlayer insulating layer 160 in the display area DA, the lower pad electrodes 170 and 171 may be disposed on the interlayer insulating layer 160 in the non-display area NA.

Figure 21:
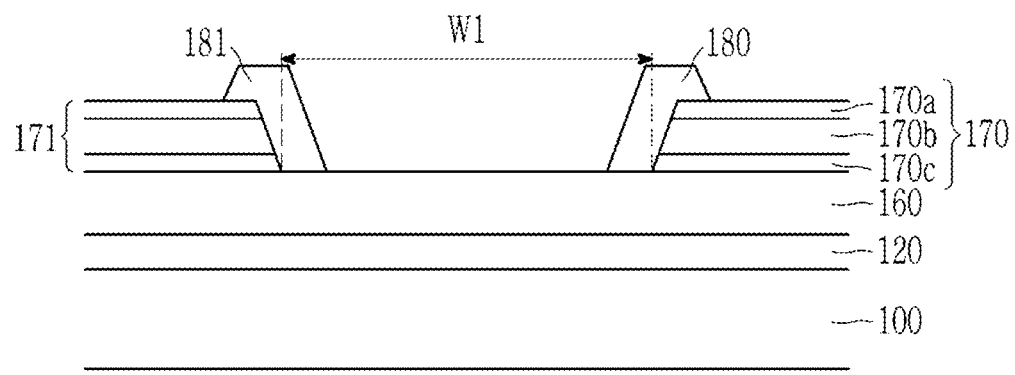

Referring to FIG. 21, the first lower planarization layer 180 and the second lower planarization layer 181 may be formed or disposed to overlap first ends of the first lower pad electrode 170 and the second lower pad electrode 171, respectively. The first lower planarization layer 180 and the second lower planarization layer 181 may be formed or disposed to partially cover or overlap the first end of the first lower pad electrode 170 and the first end of the second lower pad electrode 171 and the substrate 100. The distance W1 between the first lower pad electrode 170 and the second lower pad electrode 171 which may be adjacent to each other may be about 15 μm. The distance between the first and second lower pad electrodes 170 and 171 may vary depending on the resolution of the light emitting display device.

Figure 22:
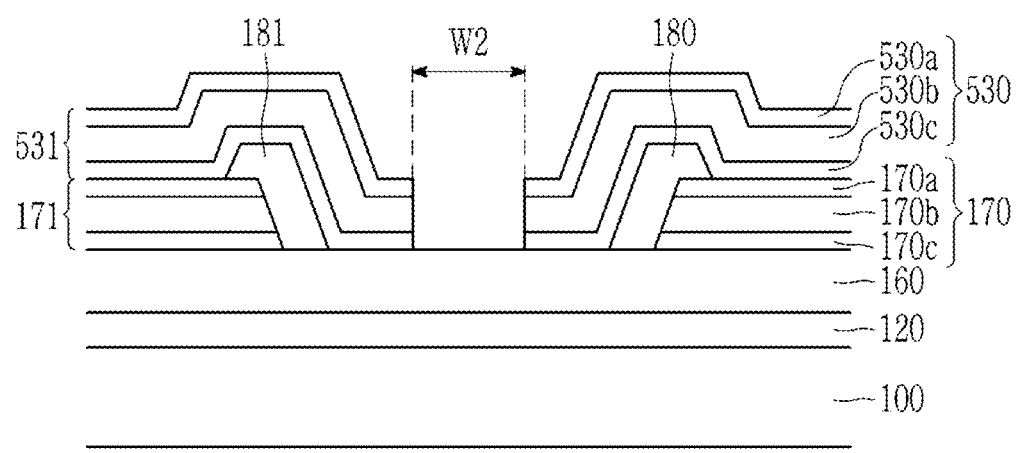

Referring to FIG. 22, the upper pad electrodes 530 and 531 may be disposed on the lower pad electrodes 170 and 171 and the lower planarization layers 180 and 181. For example, the first upper pad electrode 530 may be formed or disposed to cover or overlap the first lower pad electrode 170 and the first lower planarization layer 180, and second upper pad electrode 531 may be formed or disposed to cover or overlap the second lower pad electrodes 170 and 171 and the second lower planarization layer 181. In a case that the sensing electrodes 520 and 540 may be disposed on the lower planarization layer 180 in the display area DA, the upper pad electrodes 530 and 531 may be disposed on the lower planarization layers 180 and 181 in the non-display area NA.

The distance W2 between the first upper pad electrode 530 and the second upper pad electrode 531 which may be adjacent to each other may be about 5 μm. The distance between the first and second upper pad electrodes 530 and 531 may vary depending on the resolution of the light emitting display device. A step difference between the pads may be reduced by not matching first ends of the upper pad electrodes 530 and 531 with first ends of the lower pad electrodes 170 and 171.

Figure 23:
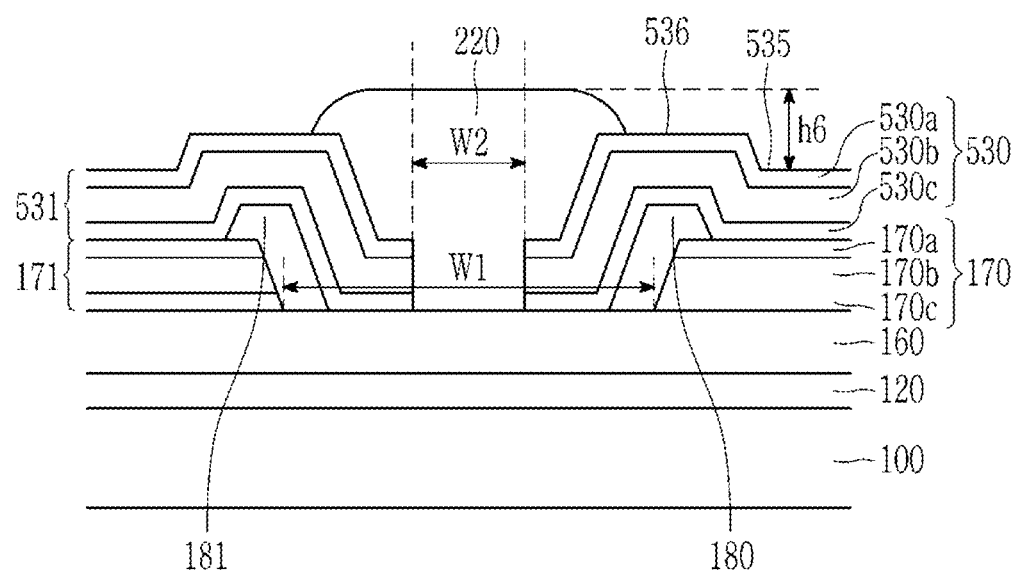

Referring to FIG. 23, the light blocking member 220 may be formed or disposed between the first upper pad electrode 530 and the second upper pad electrode 531. In a same step as the process of forming the light blocking member 220 on the sensing electrodes 520 and 540 in the display area DA, the light blocking member 220 of the non-display area NA may be formed or disposed. For example, the light blocking member 220 of the non-display area NA may be formed or disposed by using a same or similar material and a same method as those of the light blocking member 220 of the display area DA.

An upper surface of the light blocking member 220 may be formed or disposed to be higher than the upper surface of the flat portion 535 of the upper pad electrodes 530 and 531 by about 0.7 μm (see h6 in FIG. 23). Accordingly, a flexible printed circuit board (FPCB) or the like may be stably attached on the upper surface of the light blocking member 220 and the upper pad electrodes 530 and 531, and a voltage may be applied to the pad electrode.

In the light emitting display device according to an embodiment, the first ends of the upper pad electrodes 530 and 531 may be protected by the light blocking member 220, and thus the upper pad electrodes 530 and 531 may be formed, such that damage of the upper pad electrodes 530 and 531 that may occur in the color filter forming process may be reduced. Therefore, according to an embodiment, the inorganic passivation layer 505 may not be deposited or disposed on the upper pad electrodes 530 and 531.

Figure 24:
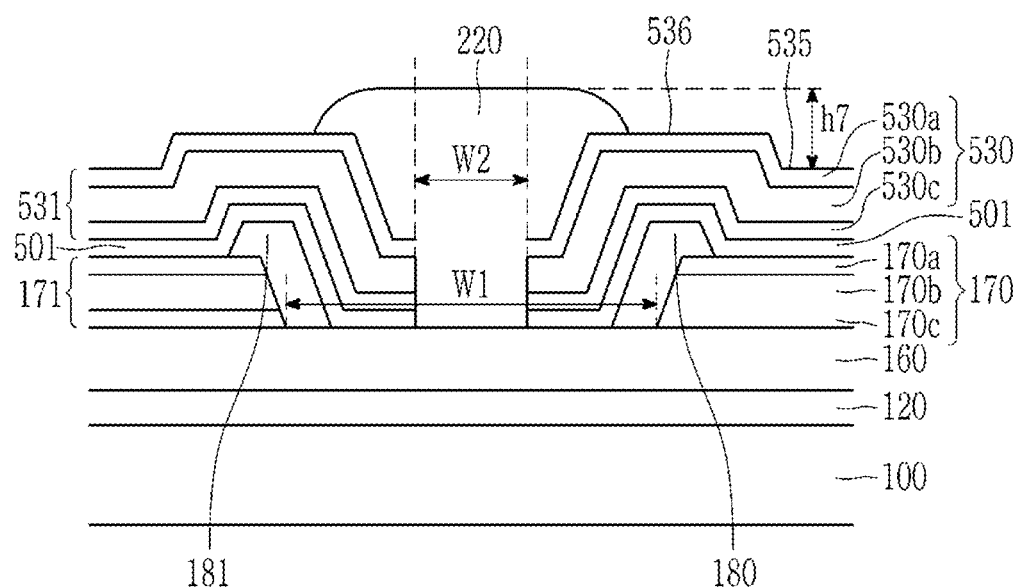
FIG. 24 illustrates a schematic cross-sectional view showing a portion of a pad in a light emitting display device according to an embodiment.

According to an embodiment, even in a case that the buffer layer 501 may be included, it may have a schematic cross-sectional structure of the pad portion 30 similar to that of FIG. 19, which is illustrated in FIG. 24.

FIG. 24 illustrates a schematic cross-sectional view showing a portion of a pad in a light emitting display device according to an embodiment.

According to FIG. 24, unlike in the structure of FIG. 19, the buffer layer 501 may be disposed on the lower pad electrodes 170 and 171 and the lower planarization layers 180 and 181, and the upper pad electrodes 530 and 531 may be disposed on the buffer layer 501. The buffer layer 501 may not be disposed between adjacent upper pad electrodes 530 and 531. However, according to an embodiment, the buffer layer 501 may be disposed between the adjacent upper pad electrodes 530 and 531.

According to FIG. 24, an upper surface of the light blocking member 220 may be formed or disposed to be higher than the upper surface of the flat portion 535 of the upper pad electrodes 530 and 531 (see h7 in FIG. 24). In a case that the upper surface of the light blocking member 220 in an embodiment of FIG. 23 may be formed or disposed to be higher than the flat portion 535 of the upper pad electrodes 530 and 531 by about 0.7 μm, it may be formed or disposed to be higher by a lower level (in a range of about 0.4 to about 0.6 μm).

Hereinafter, a schematic cross-sectional structure of the display area in the light emitting display device including the pads according to FIG. 19 to FIG. 24 will be described with reference to FIG. 25 and FIG. 26.

Figure 25:
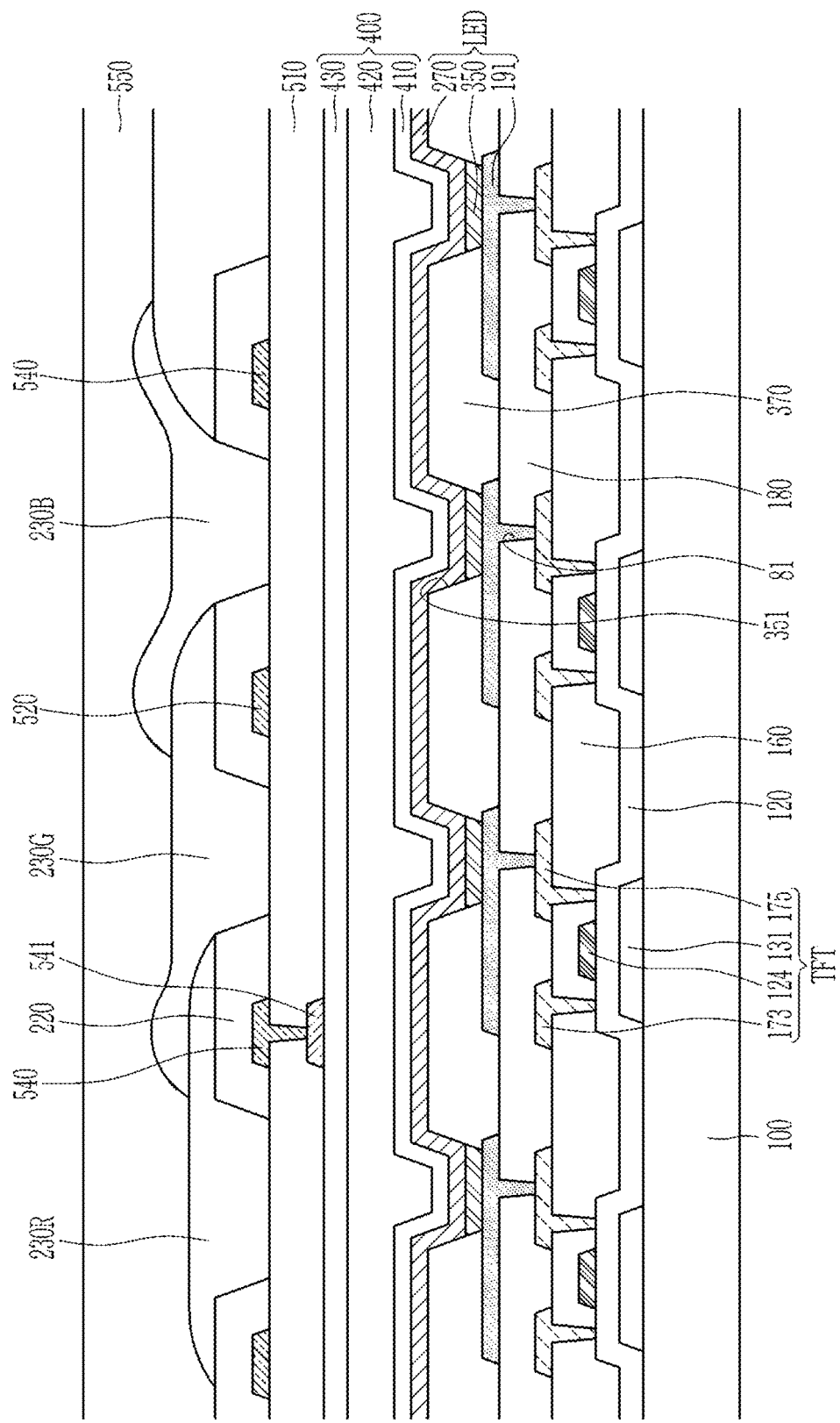
FIG. 25 and FIG. 26 illustrate schematic cross-sectional views showing a portion of a display area in a light emitting display device according to an embodiment.
Figure 26:
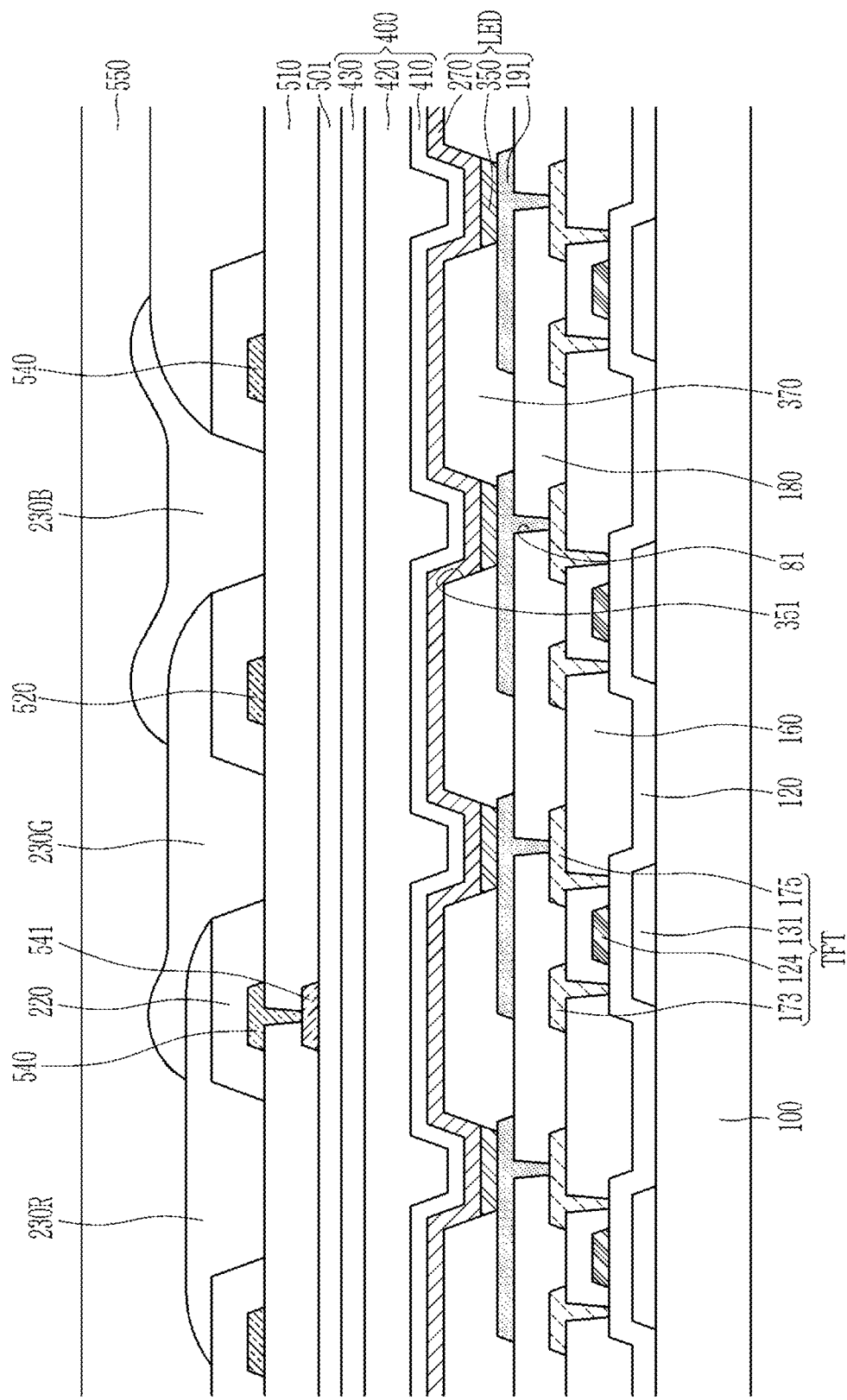

FIG. 25 and FIG. 26 illustrate schematic cross-sectional views showing a portion of a display area in a light emitting display device according to an embodiment.

First, FIG. 25 illustrates a schematic cross-sectional structure of the display area DA corresponding to the pad portion structure of FIG. 19, and FIG. 26 illustrates a schematic cross-sectional structure of the display area DA corresponding to the pad portion structure of FIG. 24.

Referring to FIG. 25, since FIG. 25 may be similar to the light emitting display device of FIG. 3 described above, hereinafter, the differences will be mainly described.

Referring to FIG. 25, unlike in FIG. 3, the inorganic passivation layer 505 may not be formed or disposed. For example, the light emitting display device according to an embodiment may include a substrate 100, a transistor TFT, a gate insulating layer 120, an interlayer insulating layer 160, a lower planarization layer 180, a light emitting diode LED, and an encapsulation layer 400. The light emitting display device may include a sensing insulating layer 510 on the encapsulation layer 400, sensing electrodes 520 and 540, a light blocking member 220, a color filter layers 230R, 230G, and 230B, and an upper planarization layer 550, and no inorganic passivation layer 505 may be formed or disposed.

The sensing electrodes 520 and 540 may be disposed on the encapsulation layer 400, and the light blocking member 220 may be disposed directly on the sensing electrodes 520 and 540 without the inorganic passivation layer 505. The light blocking member 220 may be disposed to overlap the sensing electrodes 520 and 540, and may be disposed to not overlap the emission layer 350.

As illustrated in FIG. 19, the light blocking member 220 may be disposed between the first upper pad electrode 530 and the second upper pad electrode 531 in the non-display area NA. The light blocking member 220 may be disposed to cover or overlap portions of the first upper pad electrode 530 and the second upper pad electrode 531, and the light blocking member 220 may be disposed to contact first ends of the upper pad electrodes 530 and 531.

Accordingly, in the light emitting display device according to an embodiment, end portions of the upper pad electrodes 530 and 531 may be protected by the light blocking member 220, and thus the upper pad electrodes 530 and 531 may be formed or disposed, to reduce damage of the upper pad electrodes 530 and 531 that may occur in the color filter forming process.

Therefore, the inorganic passivation layer 505 may not be formed or disposed in the display area DA.

Meanwhile, in an embodiment of FIG. 24, different from an embodiment of FIG. 19, the buffer layer 501 may be included, and thus the buffer layer 501 may be included as illustrated in FIG. 26 in the display area DA corresponding to the pad portion of FIG. 24.

In FIG. 26, different from FIG. 25, the buffer layer 501 may be included on the encapsulation layer 400. In an embodiment of FIG. 26, as illustrated in FIG. 25, the light blocking member 220 may be disposed directly on the sensing electrodes 520 and 540 without the inorganic passivation layer 505. This is because the end portions of the upper pad electrodes 530 and 531 in the pad portion 30 may be protected by the light blocking member 220, and thus the damage of the upper pad electrodes 530 and 531 may be reduced without including the inorganic passivation layer 505.

Hereinafter, a configuration of the non-display area in the light emitting display device according to an embodiment will be described with reference to FIG. 27 to FIG. 30.

Figure 27:
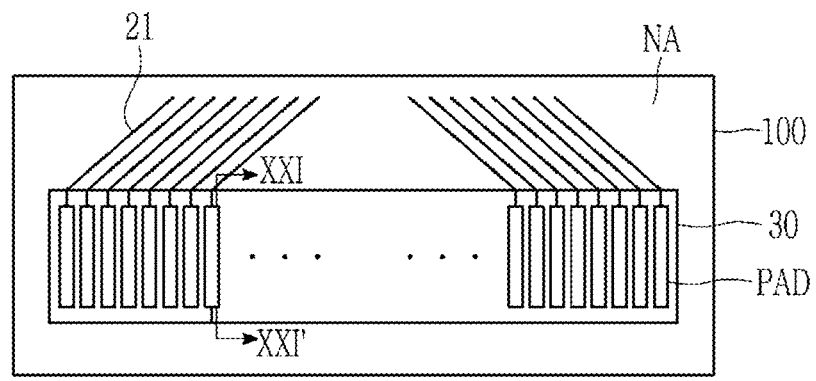
FIG. 27 illustrates a portion of a substrate including a pad portion in a light emitting display device according to an embodiment.
Figure 28:
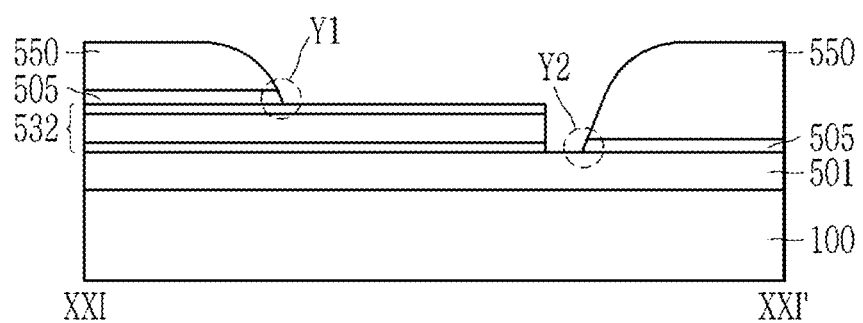
FIG. 28 illustrates a schematic cross-sectional view taken along a line XXI-XXI' of FIG. 27.
Figure 29:
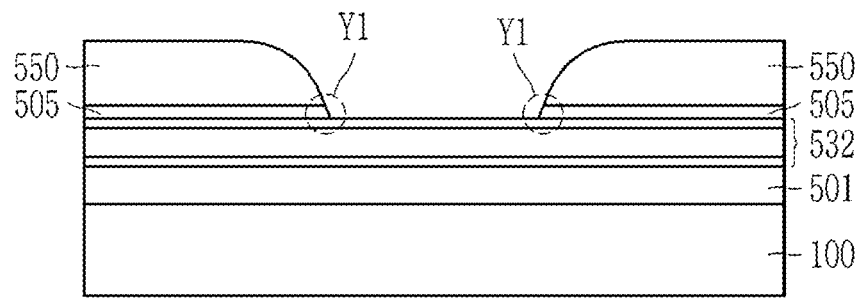
FIG. 29 and FIG. 30 illustrate an embodiment of FIG. 28.
Figure 30:
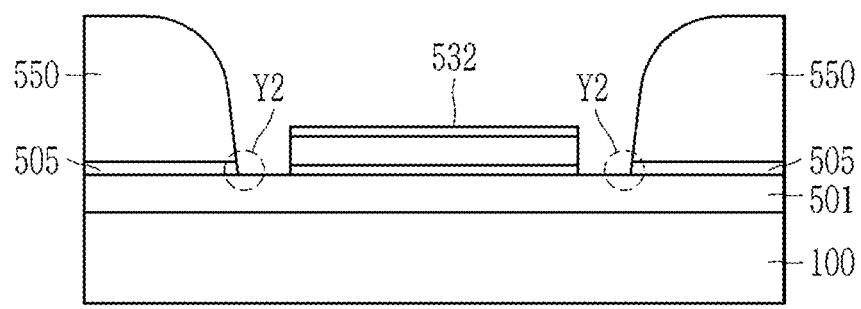

FIG. 27 illustrates a portion of a substrate including a pad portion in a light emitting display device according to an embodiment, FIG. 28 illustrates a schematic cross-sectional view taken along a line XXI-XXI' of FIG. 27, and FIG. 29 and FIG. 30 illustrate an embodiment of FIG. 28.

The pad portion 30 illustrated in FIG. 27 may correspond to the pad portion 30 of FIG. 1, and a stacking order of the light emitting display device illustrated in FIG. 28 to FIG. 30 may be the same as that of the light emitting display device of FIG. 12.

Referring to FIG. 27, pads PAD of the pad unit 30 may be respectively electrically connected to connection wires 21. The connection wires 21 may extend to the display area (DA of FIG. 1) to be electrically connected to elements, wires, and the like of the display area DA.

Referring to FIG. 28, a buffer layer 501 may be disposed on the substrate 100. The buffer layer 501 may be referred to as a pad inorganic insulating layer. Inorganic insulating layers, organic insulating layers, and lower pad electrodes may be disposed between the substrate 100 and the buffer layer 501. Although not illustrated in the drawing, for example, a gate insulating layer (120 in FIG. 6) and an interlayer insulating layer (160 in FIG. 6) may be disposed on the substrate 100, and a lower pad electrode (170 in FIG. 6) may be disposed on the interlayer insulating layer 160. The lower pad electrode 170 may have a triple layer structure, and the buffer layer 501 may be disposed on the lower pad electrode 170.

An upper pad electrode 532 may be disposed on the buffer layer 501. The upper pad electrode 532 overlaps the buffer layer 501, and the upper surface of the buffer layer 501 is exposed at a portion where the buffer layer 501 does not overlap the upper pad electrode 532. In an embodiment, the connection wires 21 may be formed or disposed at a same layer as the upper pad electrode 532, or may be formed or disposed at a same layer as the lower pad electrode 170. The upper pad electrodes 532 may be referred to collectively as a pad electrode, and may be a triple layer formed of a titanium (Ti) layer, an aluminum (Al) layer, and a titanium (Ti) layer.

An inorganic passivation layer 505 may be disposed on the buffer layer 501 and the upper pad electrode 532. The inorganic passivation layer 505 may be disposed to be spaced apart from a first end of the upper pad electrode 532, and the inorganic passivation layer 505 may be disposed to overlap only a portion of the upper pad electrode 532 on the upper pad electrode 532.

An upper planarization layer 550 may be disposed on the inorganic passivation layer 505. Referring to FIG. 3 again, in the display area DA, the upper planarization layer 550 may be disposed on the light blocking member 220 and the color filter layers 230R, 230G, and 230B, but in the non-display area NA, the upper planarization layer 550 may be positioned directly on the inorganic passivation layer 505. Each of the upper planarization layer 550 and the inorganic passivation layer 505 include an opening exposing a portion of the upper pad electrode 532.

A first end of the upper planarization layer 550 covering or overlapping the inorganic passivation layer 505 coincides or aligns with a first end of the inorganic passivation layer 505. For example, a first end of a lower surface of the upper planarization layer 550 covering or overlapping the inorganic passivation layer 505 coincides or aligns with a first end of an upper surface of the inorganic passivation layer 505. For a portion Y1, a first end of an upper surface of the inorganic passivation layer 505 disposed on the upper pad electrode 532 coincides or aligns with a first end of a lower surface of the upper planarization layer 550. For a portion Y2, a first end of an upper surface of the inorganic passivation layer 505 disposed on the buffer 501 coincides or aligns with a first end of a lower surface of the upper planarization layer 550. The first end of the planar inorganic passivation layer 505 and the first end of the upper planarization layer 550 may coincide or align with each other, and the openings positioned in the upper planarization layer 550 and the inorganic passivation layer 505 and exposing the upper pad electrode 532 may also coincide or align with each other. In a case that the inorganic passivation layer 505 and the upper planarization layer 550 may be etched with a same mask, the first end of the upper surface of the inorganic passivation layer 505 and the first end of the lower surface of the upper planarization layer 550 may coincide or align with each other, but due to a difference in etching ratios, the first ends of the inorganic passivation layer 505 and the upper planarization layer 550 may not completely coincide or align.

In the portions Y1 and Y2, a side surface of the inorganic passivation layer 505 may be formed in a substantially tapered structure obliquely in a direction that may be substantially perpendicular to the substrate 100. The side surface of the inorganic passivation layer 505 may be etched by the dry etch process, and in an embodiment, after forming the upper pad electrode 532, the damage of the upper pad electrode 532 that may occur in the color filter forming process may be reduced by forming the inorganic passivation layer 505 on the upper pad electrode 532.

The flexible printed circuit board (FPCB) or the like may be attached to a portion where the upper surface of the upper pad electrode 532 and the upper surface of the buffer layer 501 may be exposed.

Referring to FIG. 29 and FIG. 30, they have the same stacking order as that of FIG. 28, and thus the differences will be mainly described.

In FIG. 29, the upper pad electrode 532 entirely overlaps the buffer layer 501. The inorganic passivation layer 505 may be disposed so as to partially overlap and to be separated from opposite ends of the upper pad electrode 532 around the exposed portion of the upper surface of the upper pad electrode 532. The upper planarization layer 550 may be disposed on the inorganic passivation layer 505. The flexible printed circuit board (FPCB) or the like may be attached to a portion where the upper surface of the upper pad electrode 532 is exposed. The upper pad electrode 532 may extend beyond the pad portion 30 to be a portion of the connection wire 21.

For a portion Y1, a first end of an upper surface of the inorganic passivation layer 505 disposed on the upper pad electrode 532 coincides or aligns with a first end of a lower surface of the upper planarization layer 550, and the openings positioned on the upper planarization layer 550 and the inorganic protective layer 505 and exposing the upper pad electrode 532 may also coincide or align with each other.

In FIG. 30, the upper pad electrode 532 partially overlaps the buffer layer 501. The inorganic passivation layer 505 may be disposed on the buffer layer 501 to be spaced apart from opposite ends of the upper pad electrode 532. The first end of the inorganic passivation layer 505 is spaced apart from the opposite ends of the upper pad electrode 532. The connection wire 21 that may be electrically connected to the pad portion 30 may be positioned or disposed on a different layer from the upper pad electrode 532, and the upper pad electrode 532 may be electrically connected to the connection wire 21 through an opening of the insulating layer.

For a portion Y2, a first end of an upper surface of the inorganic passivation layer 505 disposed on the buffer 501 coincides or aligns with a first end of a lower surface of the upper planarization layer 550.

In the portions Y1 and Y2, side surfaces of the inorganic passivation layer 505 may be formed obliquely in a direction that may be substantially perpendicular to the substrate 100 by the dry etch process. According to an embodiment, a light emitting display device may form the inorganic passivation layer 505 on the upper pad electrode 532, to reduce damage of the upper pad electrode 532 that may occur in the color filter forming process after forming the upper pad electrode 532.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A light emitting display device comprising:
    a substrate that includes a display area and a non-display area adjacent to the display area;
    a lower pad electrode disposed on the substrate in the non-display area;
    a planarization layer made of an organic material that overlaps a portion of the lower pad electrode; and
    an upper pad electrode disposed on the lower pad electrode and overlapping at least a portion of the planarization layer, wherein
    the planarization layer includes an opening that exposes an upper surface of the lower pad electrode,
    the lower pad electrode and the upper pad electrode are electrically connected to each other through the opening,
    the planarization layer includes:
    an exposed portion where a first upper surface of the planarization layer does not contact the upper pad electrode; and
    an overlapping portion that overlaps at least a portion of the upper pad electrode such that a bottom surface of the upper pad electrode directly contacts a second upper surface of the planarization layer at the overlapping portion,
    a first height of the planarization layer at the first upper surface of the planarization layer at the exposed portion is lower than a second height of the planarization layer at the second upper surface of the planarization layer at the overlapping portion,
    an inclined surface extending an entire distance from the first upper surface of the planarization layer at the exposed portion to the second upper surface of the planarization layer at the overlapping portion, and
    an upper edge of the inclined surface directly contacts an edge of the portion of the upper pad electrode overlapping the overlapping portion of the planarization layer.

2. The light emitting display device of claim 1, wherein the upper pad electrode includes an upper layer including titanium (Ti), an intermediate layer including aluminum (Al), and a lower layer including titanium (Ti), and the lower pad electrode includes an upper layer including titanium (Ti), an intermediate layer including aluminum (Al), and a lower layer including titanium (Ti).

3. The light emitting display device of claim 1, wherein the planarization layer includes at least one of a polyimide, a polyamide, an acrylic resin, benzocyclobutene, and a phenol resin.

4. The light emitting display device of claim 1, wherein the display area includes:
a semiconductor layer disposed on the substrate;
a gate insulating layer that overlaps the semiconductor layer;
a gate electrode disposed on the gate insulating layer;
an interlayer insulating layer that overlaps the gate electrode; and
a source electrode and a drain electrode that are disposed on the interlayer insulating layer and electrically connected to the semiconductor layer, and
the lower pad electrode, the source electrode, and the drain electrode are disposed on a same layer.

5. The light emitting display device of claim 4, further comprising:
a pixel electrode disposed on the planarization layer;
an emission layer disposed on the pixel electrode; and
a common electrode disposed on the emission layer, wherein
the planarization layer overlaps the source electrode and the drain electrode, and includes a via hole, and
the drain electrode and the pixel electrode are electrically connected by the via hole.

6. The light emitting display device of claim 5, wherein the display area includes:
an encapsulation layer that overlaps the common electrode;
a sensing insulating layer disposed on the encapsulation layer;
sensing electrodes disposed on the sensing insulating layer; and
an inorganic passivation layer that overlaps the sensing electrodes, and
the sensing electrodes and the upper pad electrode are disposed on a same layer.

7. The light emitting display device of claim 6, further comprising:
a buffer layer disposed between the encapsulation layer and the sensing insulating layer and disposed between the lower pad electrode and the upper pad electrode, wherein the lower pad electrode and the upper pad electrode are electrically connected to each other.

8. A light emitting display device comprising:
a substrate that includes a display area and a non-display area adjacent to the display area;
a lower pad electrode disposed on the substrate in the non-display area;
an upper pad electrode disposed on a pad inorganic insulating layer;
an inorganic passivation layer disposed on the upper pad electrode;
a planarization layer made of an organic material and disposed on the inorganic passivation layer, wherein
a first end of the planarization layer is aligned with a first end of the inorganic passivation layer,
a second end of the planarization layer is aligned with a second end of the inorganic passivation layer,
the first end and the second end of the planarization layer are respective parts of an opening of the planarization layer and facing each other,
the first end and the second end of the inorganic passivation layer are respective parts of an opening of the inorganic passivation layer and facing each other,
the first end of the planarization layer and the first end of the inorganic passivation layer overlap the upper pad electrode in plan view, and
the second end of the inorganic passivation layer and the second end of the planarization layer are spaced apart from the upper pad electrode so a side surface of the upper pad electrode is exposed by the inorganic passivation layer and the planarization layer.

9. The light emitting display device of claim 8, wherein a lower surface of the first end of the planarization layer is aligned with an upper surface of the first end of the inorganic passivation layer.

10. The light emitting display device of claim 8, wherein the inorganic passivation layer partially overlaps the upper pad electrode, and
an upper surface of the upper pad electrode is partially exposed by the inorganic passivation layer.

11. The light emitting display device of claim 8, wherein the inorganic passivation layer is disposed on the pad inorganic insulating layer.

12. The light emitting display device of claim 8, wherein a location where the first end of the planarization layer is aligned with the first end of the inorganic passivation layer is spaced apart from the upper pad electrode in plan view.

13. The light emitting display device of claim 8, wherein the inorganic passivation layer directly contacts the pad inorganic insulating layer.

14. The light emitting display device of claim 8, wherein the inorganic passivation layer covers a touch sensing electrode.

15. The light emitting display device of claim 8, further comprising at least one of a color filter and a light blocking member disposed between the planarization layer and the inorganic passivation layer.

* * * * *